(12) United States Patent
Yoon et al.

(10) Patent No.: US 10,488,970 B2
(45) Date of Patent: Nov. 26, 2019

(54) TEMPERATURE-COMPENSATED ELECTRODE SHEET CAPABLE OF DETECTING PRESSURE AND TOUCH INPUT DEVICE

(71) Applicant: HiDeep Inc., Gyeonggi-do (KR)

(72) Inventors: Sang Sic Yoon, Gyeonggi-do (KR); Young Ho Cho, Gyeonggi-do (KR)

(73) Assignee: HIDEEP INC. (KR)

( * ) Notice: Subject to any disclaimer, the term of this patent is extended or adjusted under 35 U.S.C. 154(b) by 0 days.

(21) Appl. No.: 15/781,407

(22) PCT Filed: Nov. 28, 2016

(86) PCT No.: PCT/KR2016/013772
§ 371 (c)(1),
(2) Date: Jun. 4, 2018

(87) PCT Pub. No.: WO2017/099400
PCT Pub. Date: Jun. 15, 2017

(65) Prior Publication Data
US 2018/0348943 A1    Dec. 6, 2018

(30) Foreign Application Priority Data
Dec. 7, 2015  (KR) .................. 10-2015-0173284

(51) Int. Cl.
*G06F 3/041* (2006.01)
*G06F 3/044* (2006.01)
(Continued)

(52) U.S. Cl.
CPC ............ *G06F 3/0414* (2013.01); *G06F 3/044* (2013.01); *G06F 3/0412* (2013.01);
(Continued)

(58) Field of Classification Search
CPC ...... G06F 3/0414; G06F 3/044; G06F 3/0412; G06F 3/0416; G06F 2203/04107;
(Continued)

(56) References Cited

U.S. PATENT DOCUMENTS

| 2011/0175845 | A1* | 7/2011 | Honda .............. G06F 3/0414 345/174 |
|---|---|---|---|
| 2012/0013573 | A1 | 1/2012 | Liu et al. |

(Continued)

FOREIGN PATENT DOCUMENTS

| JP | 2011086191 | 4/2011 |
|---|---|---|
| JP | 2015170178 | 9/2015 |

(Continued)

OTHER PUBLICATIONS

Corresponding International Search Report for PCT/KR2016/013772 dated Mar. 27, 2017.

*Primary Examiner* — Muhammad N Edun
(74) *Attorney, Agent, or Firm* — The Belles Group, P.C.

(57) ABSTRACT

An electrode sheet disposed in a touch input device capable of detecting a pressure of a touch on a touch surface may be provided. The touch input device includes: a display module; a pressure electrode disposed under the display module; and a reference pressure electrode disposed under the display module. A distance between the pressure electrode and a reference potential layer is changed when the pressure is applied to the touch surface. A capacitance detected at the pressure electrode is changed according to the distance change. A magnitude of the pressure applied to the touch surface is calculated on the basis of a difference between a reference capacitance calculated from a capacitance detected at the reference pressure electrode and a detected capacitance calculated from the capacitance detected at the pressure electrode.

24 Claims, 35 Drawing Sheets

(51) Int. Cl.
*H03K 17/96* (2006.01)
*H03K 17/975* (2006.01)

(52) U.S. Cl.
CPC ......... *G06F 3/0416* (2013.01); *H03K 17/962* (2013.01); *H03K 17/975* (2013.01); *G06F 2203/04103* (2013.01); *G06F 2203/04105* (2013.01); *G06F 2203/04107* (2013.01); *G06F 2203/04112* (2013.01); *H03K 2017/9613* (2013.01); *H03K 2217/9651* (2013.01); *H03K 2217/96054* (2013.01)

(58) Field of Classification Search
CPC .......................................................................... G06F 2203/04105; G06F 2203/04112; G06F 2203/04103; H03K 17/962; H03K 17/975; H03K 2217/9651; H03K 2217/96054; H03K 2017/9613
See application file for complete search history.

(56) References Cited

U.S. PATENT DOCUMENTS

| 2015/0153887 | A1 | 6/2015 | Kim et al. |
| 2016/0282999 | A1* | 9/2016 | Hwang ................... G06F 3/044 |
| 2016/0342257 | A1 | 11/2016 | Watazu et al. |

FOREIGN PATENT DOCUMENTS

| KR | 1020120101312 | 9/2012 |
| KR | 101290735 | 7/2013 |
| KR | 101565822 | 11/2015 |

* cited by examiner

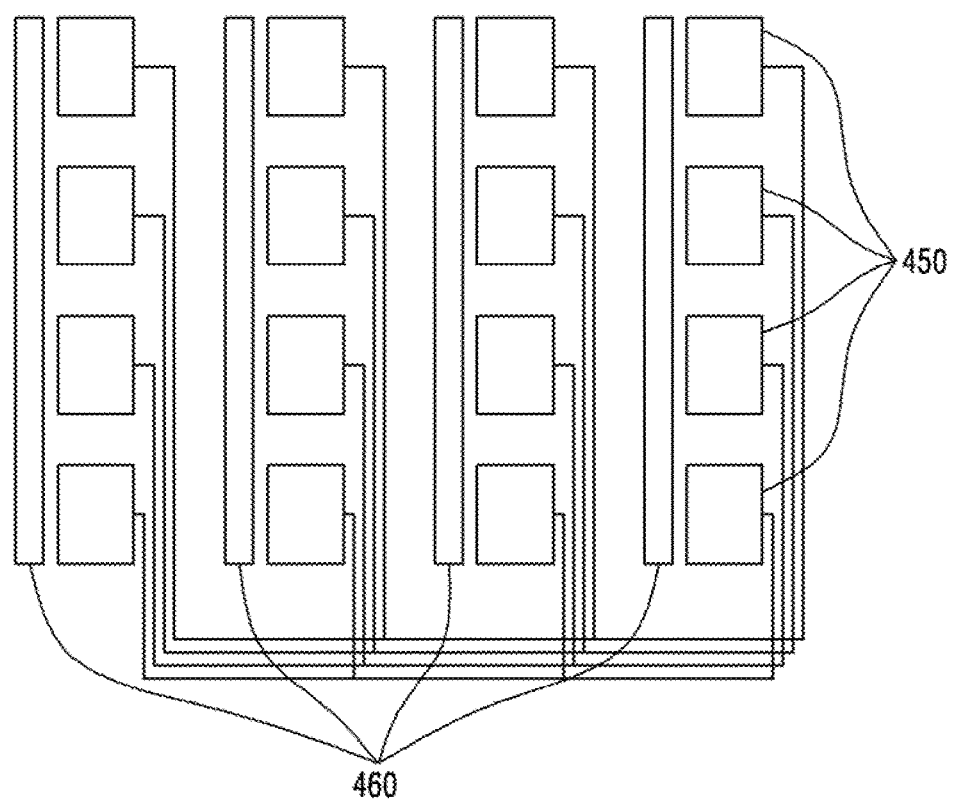

_US 10,488,970 B2_

TEMPERATURE-COMPENSATED ELECTRODE SHEET CAPABLE OF DETECTING PRESSURE AND TOUCH INPUT DEVICE

CROSS-REFERENCE TO RELATED PATENT APPLICATIONS

The present application is a U.S. national stage application under 35 U.S.C. § 371 of PCT Application No. PCT/KR2016/013772, filed Nov. 28, 2016, which claims priority to Korean Patent Application No. 10-2015-0173284, filed Dec. 7, 2015. The disclosures of the aforementioned priority applications are incorporated herein by reference in their entireties.

TECHNICAL FIELD

The present disclosure relates to an electrode sheet for pressure detection and a touch input device and more particularly to a temperature-compensated electrode sheet which is applied to a touch input device configured to detect a touch position and is capable of detecting a pressure, and the touch input device.

BACKGROUND ART

Various kinds of input devices are being used to operate a computing system. For example, the input device includes a button, key, joystick and touch screen. Since the touch screen is easy and simple to operate, the touch screen is increasingly being used to operate the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs the operations in accordance with the analysis.

Here, there is a requirement for the touch input device capable of detecting not only the touch position of the touch on the touch screen but also the accurate pressure magnitude of the touch.

DISCLOSURE

Technical Problem

The object of the present invention is to provide a temperature-compensated electrode sheet capable of detecting a pressure, and a touch input device.

Technical Solution

One embodiment is a touch input device capable of detecting a pressure of a touch on a touch surface. The touch input device includes: a display module; a pressure electrode disposed under the display module; and a reference pressure electrode disposed under the display module. A distance between the pressure electrode and a reference potential layer is changed when the pressure is applied to the touch surface. A capacitance detected at the pressure electrode is changed according to the distance change. A magnitude of the pressure applied to the touch surface is calculated on the basis of a difference between a reference capacitance calculated from a capacitance detected at the reference pressure electrode and a detected capacitance calculated from the capacitance detected at the pressure electrode.

Another embodiment is a touch input device capable of detecting a pressure of a touch on a touch surface. The touch input device includes: a display module; and a first pressure electrode and a second pressure electrode which are disposed under the display module. When the pressure is applied to the touch surface, a distance between the first pressure electrode and a reference potential layer or a distance between the second pressure electrode and the reference potential layer is changed. A capacitance detected at the first pressure electrode or the second pressure electrode is changed according to the distance change. A magnitude of the pressure which is applied to the touch surface is calculated on the basis of a difference between a reference capacitance calculated from a capacitance which is detected at an electrode disposed at a position relatively farther from the position where the pressure is applied among the first pressure electrode and the second pressure electrode and a detected capacitance calculated from a capacitance which is detected at an electrode disposed at a position relatively closer to the position where the pressure is applied among the first pressure electrode and the second pressure electrode.

Further another embodiment is an electrode sheet which is disposed in a touch input device including a substrate and a display module. The electrode sheet includes: a first insulation layer and a second insulation layer; a pressure electrode located between the first insulation layer and the second insulation layer; and a reference pressure electrode located between the first insulation layer and the second insulation layer. A capacitance which is detected at the pressure electrode is changed according to a relative distance change between the pressure electrode and a reference potential layer spaced apart from the electrode sheet. The electrode sheet is used to calculate a magnitude of a pressure applied to a touch surface of the touch input device on the basis of a difference between a reference capacitance calculated from a capacitance detected at the reference pressure electrode and a detected capacitance calculated from the capacitance detected at the pressure electrode.

Yet another embodiment is an electrode sheet which is disposed in a touch input device including a substrate and a display module. The electrode sheet includes: a first insulation layer and a second insulation layer; and a first pressure electrode and a second pressure electrode which are located between the first insulation layer and the second insulation layer. A capacitance which is detected at the first pressure electrode is changed according to a relative distance change between the first pressure electrode and a reference potential layer spaced apart from the electrode sheet, alternatively, a capacitance which is detected at the second pressure electrode is changed according to a relative distance change between the second pressure electrode and the reference potential layer spaced apart from the electrode sheet. The electrode sheet is used to a magnitude of a pressure which is applied to a touch surface of the touch input device on the basis of a difference between a reference capacitance calculated from a capacitance which is detected at an electrode disposed at a position relatively farther from a position where the pressure is applied among the first pressure electrode and the second pressure electrode and a detected capacitance calculated from a capacitance which is detected at an electrode disposed at a position relatively closer to the position where the pressure is applied among the first pressure electrode and the second pressure electrode.

Advantageous Effects

According to the embodiment of the present invention, it is possible to provide a temperature-compensated electrode sheet capable of detecting a pressure, and a touch input device.

DESCRIPTION OF DRAWINGS

FIGS. 14a to 14c show forms of a first electrode and a second electrode included in the electrode sheet according to the embodiment of the present invention.

MODE FOR INVENTION

Figure 1:
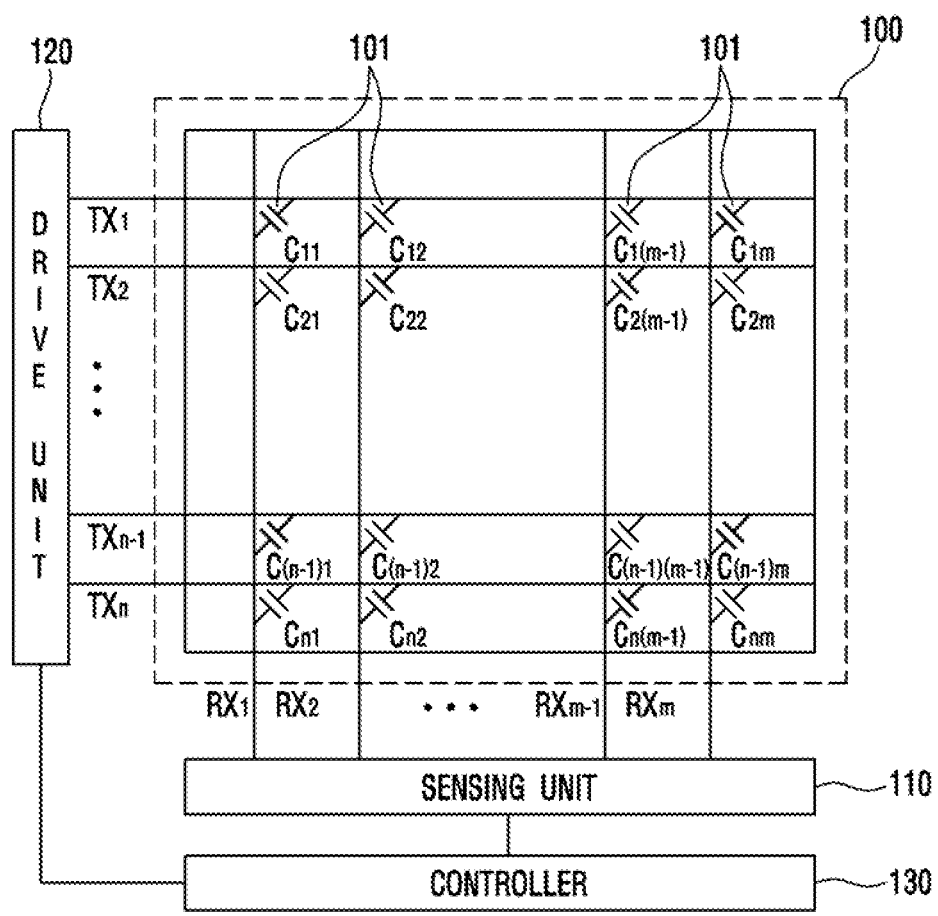
FIG. 1 is a schematic view of a configuration of a capacitance type touch sensor panel and the operation thereof.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. Similar reference numerals in the drawings designate the same or similar functions in many aspects.

Hereafter, a touch input device to which an electrode sheet for detecting a pressure can be applied according to an embodiment of the present invention will be described with reference to the accompanying drawings. While a capacitance type touch sensor panel 100 is described below, the touch sensor panel 100 may be adopted, which are capable of detecting a touch position by any method.

FIG. 1 is a schematic view of a configuration of the capacitance type touch sensor panel 100 which is included in the touch input device to which the electrode sheet according to the embodiment of the present invention can be applied, and the operation of the touch sensor panel. Referring to FIG. 1, the touch sensor panel 100 may include a plurality of drive electrodes TX1 to TXn and a plurality of receiving electrodes RX1 to RXm, and may include a drive unit 120 which applies a driving signal to the plurality of drive electrodes TX1 to TXn for the purpose of the operation of the touch sensor panel 100, and a sensing unit 110 which detects the touch and the touch position by receiving a sensing signal including information on the capacitance change amount changing according to the touch on the touch surface of the touch sensor panel 100.

As shown in FIG. 1, the touch sensor panel 100 may include the plurality of drive electrodes TX1 to TXn and the plurality of receiving electrodes RX1 to RXm. While FIG. 1 shows that the plurality of drive electrodes TX1 to TXn and the plurality of receiving electrodes RX1 to RXm of the touch sensor panel 100 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIG. 1, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may be formed to include at least any one of silver ink, copper, nano silver, and carbon nanotube (CNT). Also, the drive electrode TX and the receiving electrode RX may be made of metal mesh.

The drive unit 120 according to the embodiment of the present invention may apply a driving signal to the drive electrodes TX1 to TXn. In the embodiment of the present invention, one driving signal may be sequentially applied at a time to the first drive electrode TX1 to the n-th drive electrode TXn. The driving signal may be applied again repeatedly. This is only an example. The driving signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the driving signal has been applied, thereby detecting whether or not the touch has occurred and where the touch has occurred. For example, the sensing signal may be a signal coupled by the capacitance (Cm) 101 generated between the receiving electrode RX and the drive electrode TX to which the driving signal has been applied. As such, the process of sensing the driving signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (CM) 101, and then converts the integrated current signal into voltage. The sensing unit 110 may further include an analog to digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the driving signal can be applied to a predetermined drive electrode TX1 at a predetermined time. Also, the controller 130 generates and transmits the drive control signal to the sensing unit 110, so that the sensing unit 110 may receive the sensing signal from the predetermined receiving electrode RX at a predetermined time and perform a predetermined function.

In FIG. 1, the drive unit 120 and the sensing unit 110 may constitute a touch detection device (not shown) capable of detecting whether the touch has occurred on the touch sensor panel 100 or not and where the touch has occurred. The touch detection device may further include the controller 130. The touch detection device may be integrated and implemented on a touch sensing integrated circuit (IC, see reference numeral 150 of FIG. 12) in a touch input device 1000 including the touch sensor panel 100. The drive electrode TX and the receiving electrode RX included in the touch sensor panel 100 may be connected to the drive unit 120 and the sensing unit 110 included in the touch sensing IC 150 through, for example, a conductive trace and/or a conductive pattern printed on a circuit board, or the like. The touch sensing IC 150 may be placed on a circuit board on which the conductive pattern has been printed, for example, a first printed circuit board (hereafter, referred to as a first PCB) indicated by a reference numeral 160 of FIG. 12. According to the embodiment, the touch sensing IC 150 may be mounted on a main board for operation of the touch input device 1000.

As described above, a capacitance (C) with a predetermined value is generated at each crossing of the drive electrode TX and the receiving electrode RX. When an object like a finger approaches close to the touch sensor panel 100, the value of the capacitance may be changed. In FIG. 1, the capacitance may represent a mutual capacitance (Cm). The sensing unit 110 senses such electrical characteristics, thereby being able to sense whether the touch has occurred on the touch sensor panel 100 or not and where the touch has occurred. For example, the sensing unit 110 is able to sense whether the touch has occurred on the surface of the touch sensor panel 100 comprised of a two-dimensional plane consisting of a first axis and a second axis.

More specifically, when the touch occurs on the touch sensor panel 100, the drive electrode TX to which the driving signal has been applied is detected, so that the position of the second axial direction of the touch can be detected. Likewise, when the touch occurs on the touch sensor panel 100, a capacitance change is detected from the reception signal received through the receiving electrode RX, so that the position of the first axial direction of the touch can be detected.

The mutual capacitance type touch sensor panel as the touch sensor panel 100 has been described in detail in the foregoing. However, in the touch input device 1000 according to the embodiment of the present invention, the touch sensor panel 100 for detecting whether or not the touch has occurred and where the touch has occurred may be implemented by using not only the above-described method but also any touch sensing method like a magnetic capacitance type method, a surface capacitance type method, a projected capacitance type method, a resistance film method, a surface acoustic wave (SAW) method, an infrared method, an optical imaging method, a dispersive signal technology, and an acoustic pulse recognition method, etc.

In the touch input device 1000 to which the electrode sheet according to the embodiment of the present invention can be applied, the touch sensor panel 100 for detecting where the touch has occurred may be positioned outside or inside a display module 200.

The display module 200 of the touch input device 1000 to which the electrode sheet according to the embodiment of the present invention can be applied may be a display panel included in a liquid crystal display (LCD), a plasma display panel (PDP), an organic light emitting diode (OLED), etc. Accordingly, a user may perform the input operation by touching the touch surface while visually identifying an image displayed on the display panel. Here, the display module 200 may include a control circuit which receives an input from an application processor (AP) or a central processing unit (CPU) on a main board for the operation of the touch input device 1000 and displays the contents that the user wants on the display panel. The control circuit may be mounted on a second printed circuit board (hereafter, referred to as a second PCB) (210) in FIGS. 11a to 13d. Here, the control circuit for the operation of the display module 200 may include a display panel control IC, a graphic controller IC, and a circuit required to operate other display panels 200.

Figure 2A:
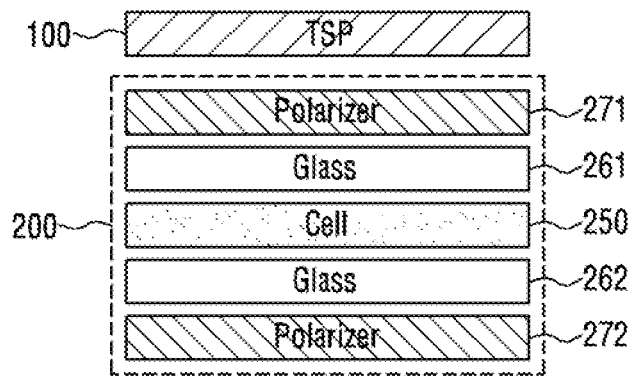
FIGS. 2a, 2b and 2c are conceptual views showing a relative position of the touch sensor panel with respect to a display module in a touch input device.
Figure 2B:
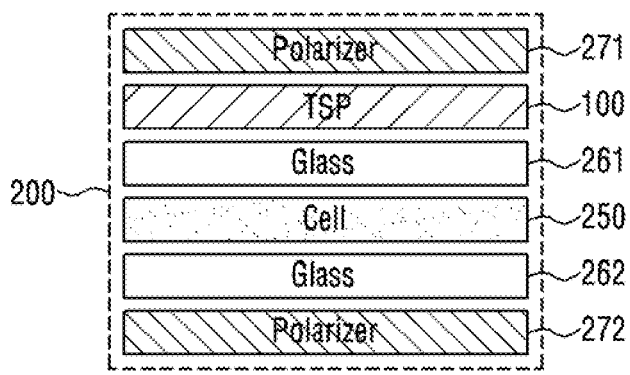
Figure 2C:
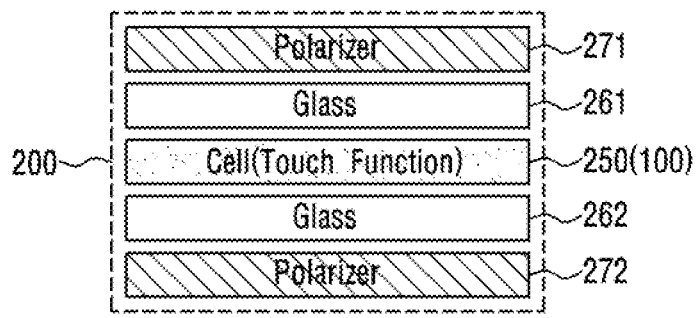

FIGS. 2a, 2b and 2c are conceptual views showing a relative position of the touch sensor panel with respect to the display module in the touch input device to which the electrode sheet according to the embodiment of the present invention can be applied. While FIGS. 2a to 2c show an LCD panel as a display panel 200A included within the display module 200, this is just an example. Any display panel may be applied to the touch input device 1000.

In this specification, the reference numeral 200A may designate the display panel included in the display module 200. As shown in FIG. 2, the LCD panel 200A may include a liquid crystal layer 250 including a liquid crystal cell, a first glass layer 261 and a second glass layer 262 which are disposed on both sides of the liquid crystal layer 250 and include electrodes, a first polarizer layer 271 formed on a side of the first glass layer 261 in a direction facing the liquid crystal layer 250, and a second polarizer layer 272 formed on a side of the second glass layer 262 in the direction facing the liquid crystal layer 250. It is clear to those skilled in the art that the LCD panel may further include other configurations for the purpose of performing the displaying function and may be transformed.

FIG. 2a shows that the touch sensor panel 100 of the touch input device 1000 is disposed outside the display module 200. The touch surface of the touch input device 1000 may be the surface of the touch sensor panel 100. In FIG. 2a, the top surface of the touch sensor panel 100 is able to function as the touch surface. Also, according to the embodiment, the touch surface of the touch input device 1000 may be the outer surface of the display module 200. In FIG. 2a, the bottom surface of the second polarizer layer 272 of the display module 200 is able to function as the touch surface. Here, in order to protect the display module 200, the bottom surface of the display module 200 may be covered with a cover member (not shown).

FIGS. 2b and 2c show that the touch sensor panel 100 of the touch input device 1000 is disposed inside the display panel 200A. Here, in FIG. 2b, the touch sensor panel 100 for detecting the touch position is disposed between the first glass layer 261 and the first polarizer layer 271. Here, the touch surface of the touch input device 1000 is the outer surface of the display module 200. The top surface or bottom surface of the display module 200 in FIG. 2b may be the touch surface. FIG. 2c shows that the touch sensor panel 100 for detecting the touch position is included in the liquid crystal layer 250. Also, according to the embodiment, the touch sensor panel 100 may be implemented such that the electrical devices for the operation of the display panel 200A are used for the touch sensing. Here, the touch surface of the touch input device 1000 is the outer surface of the display module 200. The top surface or bottom surface of the display module 200 in FIG. 2c may be the touch surface. In FIGS. 2b and 2c, the top surface of the display module 200, which can be the touch surface, may be covered with a cover layer (not shown) like glass.

The foregoing has described the touch sensor panel 100 including the touch sensor panel 100 capable of detecting whether the touch has occurred or not and/or where the touch has occurred. By applying the electrode sheet according to the embodiment of the present invention to the aforesaid touch input device 1000, it is possible to easily detect the magnitude of the touch pressure as well as whether the touch has occurred or not and/or where the touch has occurred. Hereafter, described in detail is an example of a case of detecting the touch pressure by applying the electrode sheet according to the embodiment of the present invention to the touch input device 1000.

Figure 3A:
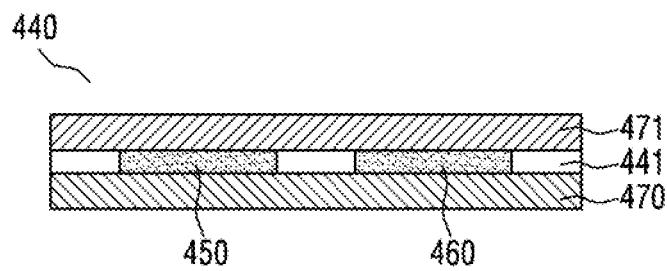
FIG. 3a is an exemplary cross sectional view of an electrode sheet including a pressure electrode according to an embodiment of the present invention.

FIG. 3a is an exemplary cross sectional views of an electrode sheet including a pressure electrode according to the embodiment of the present invention. For example, an electrode sheet 440 may include an electrode layer 441 between a first insulation layer 470 and a second insulation layer 471. The electrode layer 441 may include a first electrode 450 and/or a second electrode 460. Here, the first insulation layer 470 and the second insulation layer 471 may be made of an insulating material like polyimide. The first electrode 450 and/or the second electrode 460 included in the electrode layer 441 may include a material like copper. In accordance with the manufacturing process of the electrode sheet 440, the electrode layer 441 and the second insulation layer 471 may be adhered to each other by means of an adhesive (not shown) like an optically clear adhesive (OCA). Also, the pressure electrodes 450 and 460 according to the embodiment may be formed by positioning a mask, which has a through-hole corresponding to a pressure electrode pattern, on the first insulation layer 470, and then by spraying a conductive material.

FIGS. 4a to 4f show a first example in which an electrode sheet according to the embodiment of the present invention is applied to the touch input device.

In the touch input device 1000 according to the first example of the present invention, the lamination is made by an adhesive like the optically clear adhesive (OCA) between the touch sensor panel 100 and the display module 200 for detecting the touch position. As a result, the display color clarity, visibility and optical transmittance of the display module 200, which can be recognized through the touch surface of the touch sensor panel 100, can be improved.

Figure 4A:
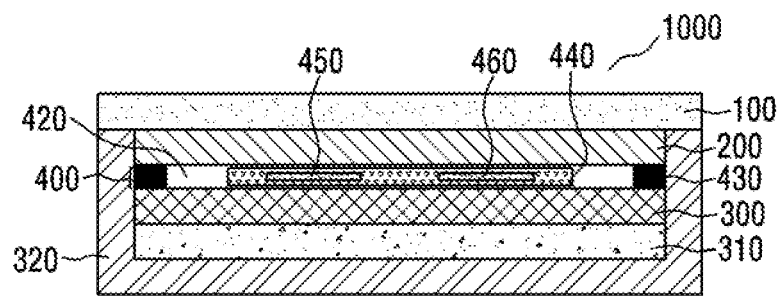
FIGS. 4a to 4f show a first example in which the electrode sheet according to the embodiment of the present invention is applied to the touch input device.
Figure 4B:
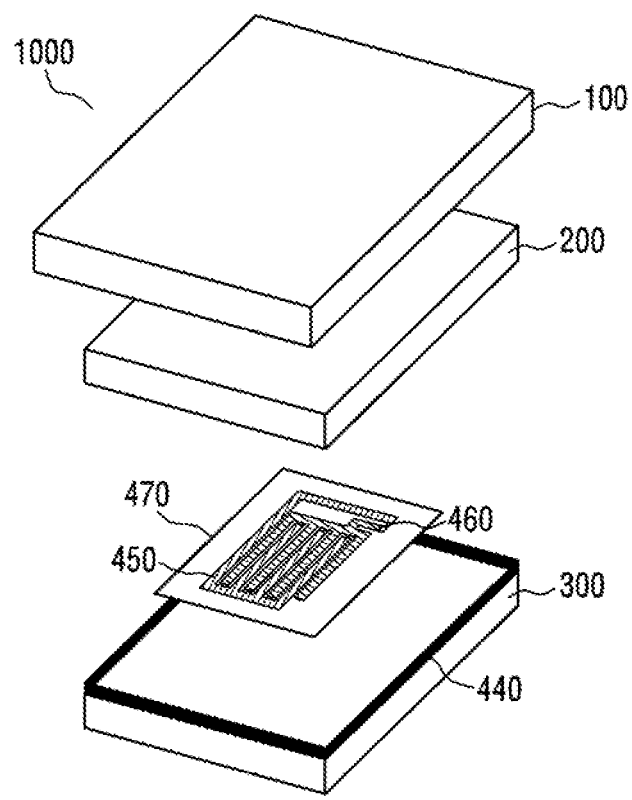

In the description with reference to FIGS. 4a to 4f, it is shown that as the touch input device 1000 according to the first example of the present invention, the touch sensor panel 100 is laminated and attached on the display module 200 by means of an adhesive. However, the touch input device 1000 according to the first example of the present invention may include, as shown in FIGS. 2b and 2c, that the touch sensor panel 100 is disposed inside the display module 200. More specifically, while FIGS. 4a and 4b show that the touch sensor panel 100 covers the display module 200, the touch input device 1000 which includes the touch sensor panel 100 disposed inside the display module 200 and includes the display module 200 covered with a cover layer like glass may be used as the first example of the present invention.

The touch input device 1000 to which the electrode sheet according to the embodiment of the present invention can be applied may include an electronic device including the touch screen, for example, a cell phone, a personal data assistant (PDA), a smart phone, a tablet personal computer, an MP3 player, a laptop computer, etc.

In the touch input device 1000 to which the electrode sheet according to the embodiment of the present invention can be applied, a substrate 300, together with an outermost cover 320 of the touch input device 1000, functions as, for example, a housing which surrounds a mounting space 310, etc., where the circuit board and/or battery for operation of the touch input device 1000 are placed. Here, the circuit board for operation of the touch input device 1000 may be a main board. A central processing unit (CPU), an application processor (AP) or the like may be mounted on the circuit board. Due to the substrate 300, the display module 200 is separated from the circuit board and/or battery for operation of the touch input device 1000. Due to the substrate 300, electrical noise generated from the display module 200 can be blocked.

The touch sensor panel 100 or front cover layer of the touch input device 1000 may be formed wider than the display module 200, the substrate 300, and the mounting space 310. As a result, the cover 320 is formed such that the cover 320, together with the touch sensor panel 100, surrounds the display module 200, the substrate 300, and a circuit board.

The touch input device 1000 according to the first example of the present may detect the touch position through the touch sensor panel 100 and may detect the touch pressure by disposing the electrode sheet 440 between the display module 200 and the substrate 300. Here, the touch sensor panel 100 may be disposed inside or outside the display module 200.

Hereafter, the configuration which includes the electrode sheet 440 and is for the pressure detection is collectively referred to as a pressure detection module 400. For example, in the first example, the pressure detection module 400 may include the electrode sheet 440 and/or a spacer layer 420. Also, the pressure detection module 400 may further include a pressure detection device to be later in detail.

As described above, the pressure detection module 400 is formed to include, for example, the spacer layer 420 consisting of an air gap. This will be described in detail with reference to FIGS. 4b to 4f. The spacer layer 420 may be made of an impact absorbing material in accordance with the embodiment. The spacer layer 420 may be filled with a dielectric material in accordance with the embodiment.

FIG. 4b is a perspective view of the touch input device 1000 according to the first example of the present invention. As shown in FIG. 4b, in the touch input device 1000, the electrode sheet 440 of the first example may be disposed between the display module 200 and the substrate 300. Here, for the purpose of disposing the electrode sheet 440, the touch input device 1000 may include the spacer layer 420 which causes the display module 200 and the substrate 300 to be spaced apart from each other.

Hereafter, for the purpose of clearly distinguishing the electrodes 450 and 460 from the electrode included in the touch sensor panel 100, the electrodes 450 and 460 for detecting the pressure are designated as pressure electrodes 450 and 460. Here, since the pressure electrodes 450 and 460 are included in the rear side instead of in the front side of the display panel, the pressure electrodes 450 and 460 may be made of an opaque material as well as a transparent material.

Here, a frame 430 with a predetermined thickness may be formed along the border of the upper portion of the substrate 300 in order to maintain the spacer layer 420 in which the electrode sheet 440 is disposed. Here, the frame 430 may be an adhesive tape. While FIG. 4b shows the frame 430 is formed on the entire border (e.g., four sides of the quadrangle) of the substrate 300, the frame 430 may be formed only on at least some (e.g., three sides of the quadrangle) of the border of the substrate 300. According to the embodiment, the frame 430 may be formed on the top surface of the substrate 300 or on the bottom surface of the display module 200. The frame 430 may be a conductive tape such that the substrate 300 and the display module 200 have the same electric potential. The frame 430 may be a double adhesive tape. In the embodiment of the present invention, the frame 430 may be made of an inelastic material. In the embodiment of the present invention, when a pressure is applied to the display module 200, the display module 200 may be bent. Therefore, the magnitude of the touch pressure can be detected even though the frame 430 is not transformed by the pressure.

Although the example of using the frame 430 has been described with regard to FIGS. 4a to 4f, the electrode sheet 440 may be disposed in a space formed between the display module 200 and the substrate 300 without using the frame 430 in the manufacturing of the touch input device 1000.

Figure 4C:
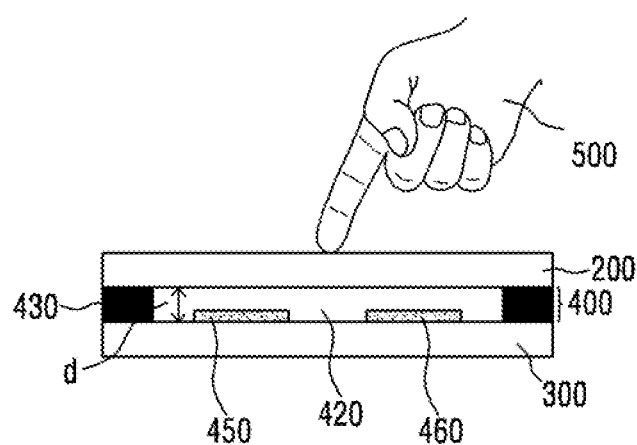

FIG. 4c is a cross sectional view of the touch input device including the pressure electrode of the electrode sheet according to the embodiment of the present invention. While FIG. 4c and some of the following figures show that the pressure electrodes 450 and 460 are separated from the electrode sheet 440, this is only for convenience of description. The pressure electrodes 450 and 460 may be included in the electrode sheet 440. As shown in FIG. 4c, the electrode sheet 440 including the pressure electrodes 450 and 460 according to the embodiment of the present invention may be disposed within the spacer layer 420 and on the substrate 300.

The pressure electrode for detecting the pressure may include the first electrode 450 and the second electrode 460. Here, any one of the first and the second electrodes 450 and 460 may be a drive electrode and the other may be a receiving electrode. A driving signal is applied to the drive electrode, and a sensing signal may be obtained through the receiving electrode. When voltage is applied, the mutual capacitance may be generated between the first electrode 450 and the second electrode 460.

Figure 4D:
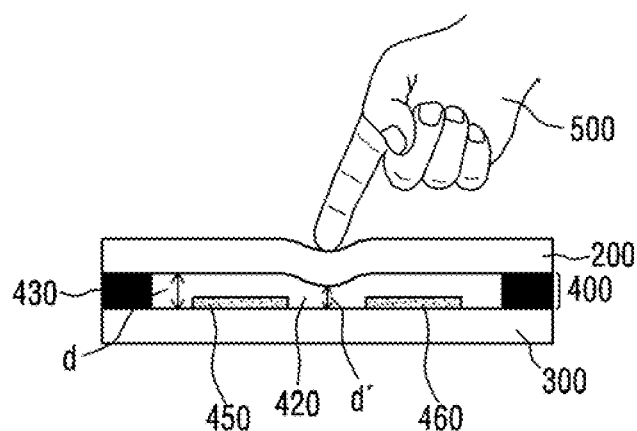

FIG. 4d is a cross sectional view when a pressure is applied to the touch input device 1000 shown in FIG. 4c. The bottom surface of the display module 200 may have a ground potential so as to block the noise. When the pressure is applied to the surface of the touch sensor panel 100 by an object 500, the touch sensor panel 100 and the display module 200 may be bent or pressed. As a result, a distance "d" between the ground potential surface and the pressure electrode 450 and 460 may be decreased to "d'". In this case, due to the decrease of the distance "d", the fringing capacitance is absorbed in the bottom surface of the display module 200, so that the mutual capacitance between the first electrode 450 and the second electrode 460 may be reduced. Therefore, the magnitude of the touch pressure can be calculated by obtaining the reduction amount of the mutual capacitance from the sensing signal obtained through the receiving electrode.

In the touch input device 1000 to which the electrode sheet 440 is applied according to the embodiment of the present invention, the display module 200 may be bent or pressed by the touch pressure. The display module 200 may be bent or pressed in such a manner as to show the transformation caused by the touch. When the display module 200 is bent or pressed according to the embodiment, a position showing the biggest transformation may not match the touch position. However, the display module 200 may be shown to be bent at least at the touch position. For example, when the touch position approaches close to the border, edge, etc., of the display module 200, the most bent or pressed position of the display module 200 may not match the touch position, however, the display module 200 may be shown to be bent or pressed at least at the touch position.

Figure 9:
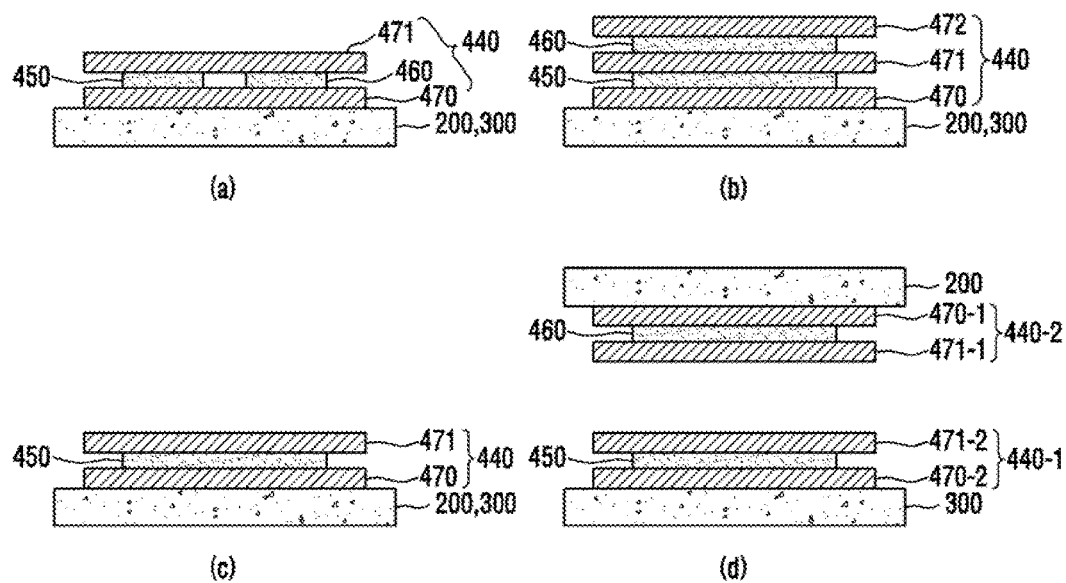
FIGS. 9a to 9d show cross sections of the electrode sheet according to the embodiment of the present invention.

Here, the top surface of the substrate 300 may also have the ground potential in order to block the noise. FIG. 9 shows cross section of the electrode sheet according to the embodiment of the present invention. Referring to FIG. 9*a*, FIG. 9*a* shows a cross section when the electrode sheet 440 including the pressure electrodes 450 and 460 is attached to the substrate 300 or the display module 200. Here, in the electrode sheet 440, since the pressure electrodes 450 and 460 are disposed between the first insulation layer 470 and the second insulation layer 471, a short-circuit can be prevented from occurring between the pressure electrodes 450 and 460 and either the substrate 300 or the display module 200. Also, depending on the kind and/or implementation method of the touch input device 1000, the substrate 300 or the display module 200 on which the pressure electrodes 450 and 460 are attached may not have the ground potential or may have a weak ground potential. In this case, the touch input device 1000 according to the embodiment of the present may further include a ground electrode (not shown) between the first insulation layer 470 and either the substrate 300 or the display module 200. According to the embodiment, another insulation layer (not shown) may be included between the ground electrode and either the substrate 300 or the display module 200. Here, the ground electrode (not shown) is able to prevent the size of the capacitance generated between the first electrode 450 and the second electrode 460, which are pressure electrodes, from increasing excessively.

Figure 4E:
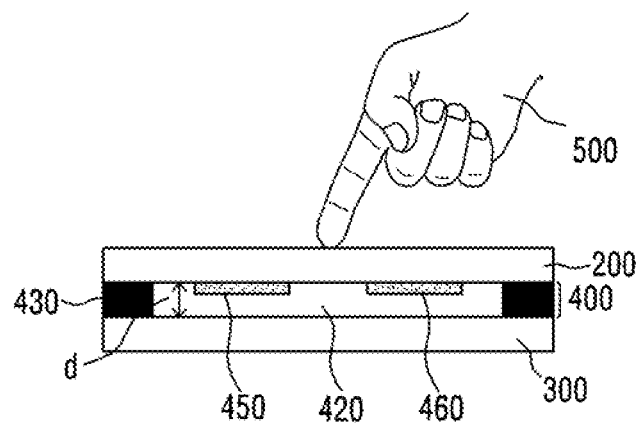

FIG. 4*e* shows that the electrode sheet 440 including the pressure electrodes 450 and 460 according to the embodiment of the present invention is formed on the bottom surface of the display module 200. Here, the substrate 300 may have the ground potential. Therefore, a distance "d" between the substrate 300 and the pressure electrodes 450 and 460 is reduced by touching the touch surface of the touch sensor panel 100. Consequently, this may cause the change of the mutual capacitance between the first electrode 450 and the second electrode 460.

FIG. 7 shows pressure electrode patterns included in the electrode sheet for detecting a pressure in accordance with the embodiment of the present invention. FIGS. 7*a* to 7*c* show the patterns of the first electrode 450 and the second electrode 460 included in the electrode sheet 440. The electrode sheet 440 including the pressure electrode patterns shown in FIGS. 7*a* to 7*c* may be formed on the substrate 300 or on the bottom surface of the display module 200. The capacitance between the first electrode 450 and the second electrode 460 may be changed depending on a distance between a reference potential layer (display module 200 or substrate 300) and the electrode layer including both the first electrode 450 and the second electrode 460.

When the magnitude of the touch pressure is detected as the mutual capacitance between the first electrode 450 and the second electrode 460 is changed, it is necessary to form the patterns of the first electrode 450 and the second electrode 460 so as to generate the range of the capacitance required to improve the detection accuracy. With the increase of a facing area or facing length of the first electrode 450 and the second electrode 460, the size of the capacitance that is generated may become larger. Therefore, the pattern can be designed by adjusting the size of the facing area, facing length and facing shape of the first electrode 450 and the second electrode 460 in accordance with the range of the necessary capacitance. FIGS. 7*b* and 7*c* show that the first electrode 450 and the second electrode 460 are formed in the same layer, and show that the pressure electrode is formed such that the facing length of the first electrode 450 and the second electrode 460 becomes relatively longer.

Figure 14A:
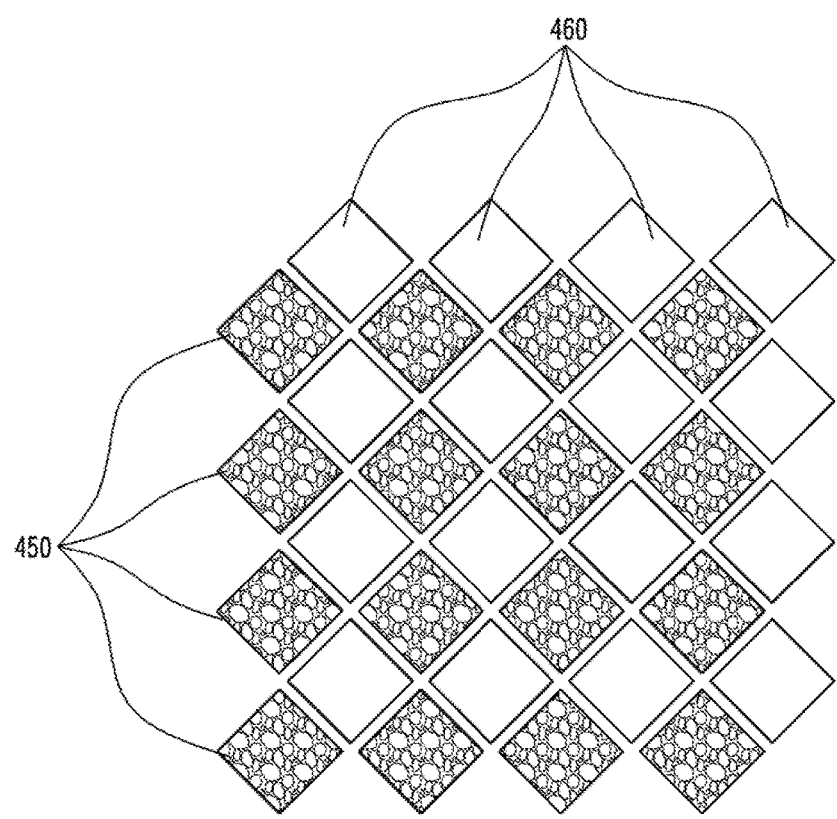

As such, in the state where the first electrode 450 and the second electrode 460 are formed in the same layer, each of the first electrode 450 and the second electrode 460 shown in FIG. 9*a* may be, as shown in FIG. 14*a*, composed of a plurality of lozenge-shaped electrodes. Here, the plurality of the first electrodes 450 are connected to each other in a first axial direction, and the plurality of the second electrodes 460 are connected to each other in a second axial direction orthogonal to the first axial direction. The lozenge-shaped electrodes of at least one of the first and the second electrodes 450 and 460 are connected to each other through a bridge, so that the first electrode 450 and the second electrode 460 may be insulated from each other. Also, here, the first electrode 450 and the second electrode 460 shown in FIG. 9*a* may be composed of an electrode having a form shown in FIG. 14*b*.

Figure 14C:
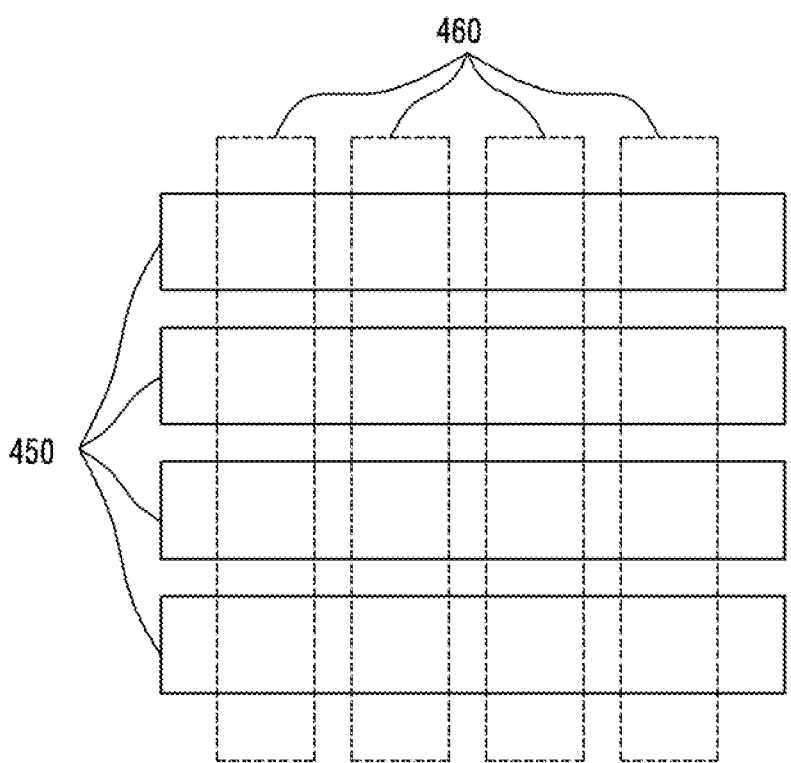

It can be considered that the first electrode 450 and the second electrode 460 are formed in different layers in accordance with the embodiment and form the electrode layer. FIG. 9*b* shows a cross section when the first electrode 450 and the second electrode 460 are formed in different layers. As shown in FIG. 9*b*, the first electrode 450 may be formed on the first insulation layer 470, and the second electrode 460 may be formed on the second insulation layer 471 positioned on the first electrode 450. According to the embodiment, the second electrode 460 may be covered with a third insulation layer 472. In other words, the electrode sheet 440 may include the first to the third insulation layers 470 to 472, the first electrode 450, and the second electrode 460. Here, since the first electrode 450 and the second electrode 460 are disposed in different layers, they can be implemented so as to overlap each other. For example, the first electrode 450 and the second electrode 460 may be, as shown in FIG. 14*c*, formed similarly to the pattern of the drive electrode TX and receiving electrode RX which are arranged in the form of M×N array. Here, M and N may be natural numbers greater than 1. Also, as shown in FIG. 14*a*, the lozenge-shaped first and the second electrodes 450 and 460 may be disposed in different layers respectively.

In the foregoing, it is shown that the touch pressure is detected from the change of the mutual capacitance between the first electrode 450 and the second electrode 460. However, the electrode sheet 440 may be configured to include only any one of the first electrode 450 and the second electrode 460. In this case, it is possible to detect the magnitude of the touch pressure by detecting the change of the capacitance between the one pressure electrode and a ground layer (either the display module 200 or the substrate 300), that is to say, the self-capacitance. Here, the driving signal is applied to the one pressure electrode, and the change of the self-capacitance between the pressure electrode and the ground layer can be detected by the pressure electrode.

For instance, in FIG. 4c, the pressure electrode included in the electrode sheet 440 may be configured to include only the first electrode 450. Here, the magnitude of the touch pressure can be detected by the change of the capacitance between the first electrode 450 and the display module 200, which is caused by a distance change between the display module 200 and the first electrode 450. Since the distance "d" is reduced with the increase of the touch pressure, the capacitance between the display module 200 and the first electrode 450 may be increased with the increase of the touch pressure. This can be applied in the same manner to the embodiment related to FIG. 4e. Here, the pressure electrode should not necessary have a comb teeth shape or a trident shape, which is required to improve the detection accuracy of the mutual capacitance change amount. The pressure electrode may have, as shown in FIG. 7d, a plate shape (e.g., quadrangular plate).

FIG. 9c shows a cross section when the electrode sheet 440 is formed to include only the first electrode 450. As shown in FIG. 9c, the electrode sheet 440 including the first electrode 450 may be disposed on the substrate 300 or on the display module 200.

Figure 4F:
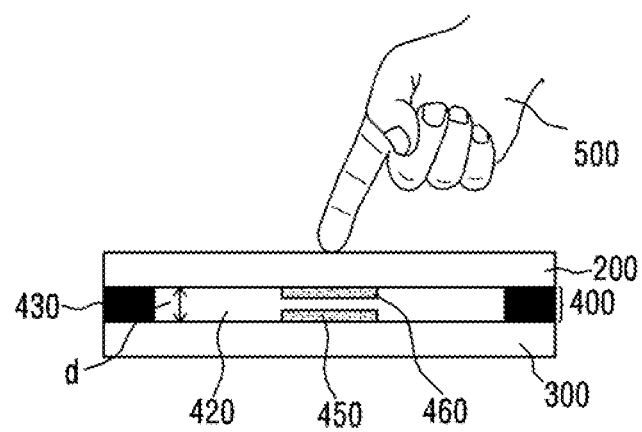

FIG. 4f shows that the pressure electrodes 450 and 460 are formed within the spacer layer 420 and on the top surface of the substrate 300 and on the bottom surface of the display module 200. The electrode sheet may include a first electrode sheet 440-1 including the first electrode 450 and a second electrode sheet 440-2 including the second electrode 460. Here, any one of the first electrode 450 and the second electrode 460 may be formed on the substrate 300, and the other may be formed on the bottom surface of the display module 200. FIG. 4f shows that the first electrode 450 is formed on the substrate 300, and the second electrode 460 is formed on the bottom surface of the display module 200.

When the pressure is applied to the surface of the touch sensor panel 100 by the object 500, the touch sensor panel 100 and the display module 200 may be bent or pressed. As a result, a distance "d" between the first electrode 450 and the second electrode 460 may be reduced. In this case, the mutual capacitance between the first electrode 450 and the second electrode 460 may be increased with the reduction of the distance "d". Therefore, the magnitude of the touch pressure can be calculated by obtaining the increase amount of the mutual capacitance from the sensing signal obtained through the receiving electrode. Here, the patterns of the first electrode 450 and the second electrode 460 may have a shape as shown in FIG. 7d respectively. That is, since the first electrode 450 and the second electrode 460 are formed in different layers in FIG. 4f, the first electrode 450 and the second electrode 460 should not necessary have a comb teeth shape or a trident shape, and may have a plate shape (e.g., quadrangular plate).

FIG. 9d shows a cross section when the first electrode sheet 440-1 including the first electrode 450 is attached to the substrate 300 and the second electrode sheet 440-2 including the second electrode 460 is attached to the display module 200. As shown in FIG. 9d, the first electrode sheet 440-1 including the first electrode 450 may be disposed on the substrate 300. Also, the second electrode sheet 440-2 including the second electrode 460 may be disposed on the bottom surface of the display module 200.

As with the description related to FIG. 9a, when substrate 300 or the display module 200 on which the pressure electrodes 450 and 460 are attached may not have the ground potential or may have a weak ground potential, the electrode sheet 440 may further include, as shown in FIGS. 9a to 9d, a ground electrode (not shown) under the first insulation layers 470, 470-1, and 470-2 disposed to contact with the substrate 300 or the display module 200. Here, the electrode sheet 440 may further include an additional insulation layer (not shown) which is opposite to the first insulation layers 470, 470-1, and 470-2 such that the ground electrode (not shown) is located between the additional insulation layer and the first insulation layers 470, 470-1, and 470-2.

FIGS. 5a to 5i show a second example in which the electrode sheet according to the embodiment of the present invention is applied to the touch input device. The second example of the present invention is similar to the first example described with reference to FIGS. 4a to 4f. Hereafter, the following description will focus on differences between the first and second examples.

Figure 5A:
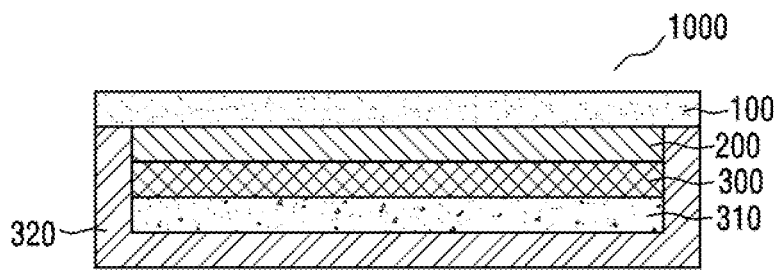
FIGS. 5a to 5i show a second example in which the electrode sheet according to the embodiment of the present invention is applied to the touch input device.

FIG. 5a is a cross sectional view of the touch input device in which the electrode sheet 440 has been disposed according to the second example.

In the touch input device 1000 according to the second example of the present invention, the touch pressure can be detected by using the air gap and/or potential layer which are positioned inside or outside the display module 200 without manufacturing a separate spacer layer and/or reference potential layer. This will be described in detail with reference to FIGS. 5b to 5i.

Figure 5B:
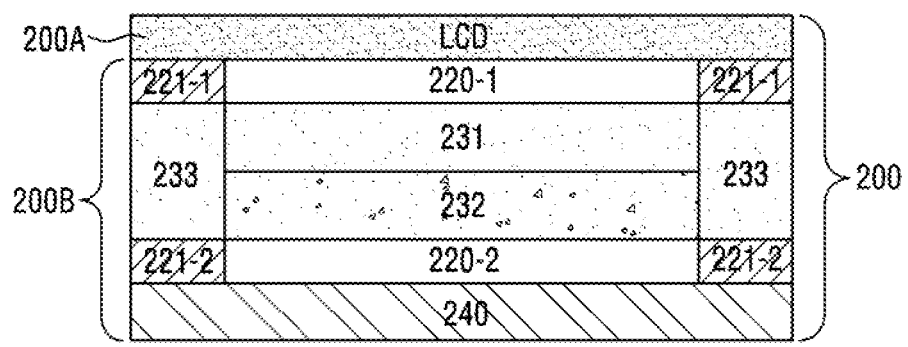

FIG. 5b is an exemplary cross sectional view of the display module 200 which can be included in the touch input device 1000 according to the second example of the present invention. FIG. 5b shows an LCD module as the display module 200. As shown in FIG. 5b, the LCD module 200 may include an LCD panel 200A and a backlight unit 200B. The LCD panel 200A cannot emit light in itself but simply performs a function to block or transmit the light. Therefore, a light source is positioned in the lower portion of the LCD panel 200A and light is illuminated onto the LCD panel 200A, so that a screen displays not only brightness and darkness but information with various colors. Since the LCD panel 200A is a passive device and cannot emit the light in itself, a light source having a uniform luminance distribution is required on the rear side. The structures and functions of the LCD panel 200A and the backlight unit 200B have been already known to the public and will be briefly described below.

The backlight unit 200B for the LCD panel 200A may include several optical parts. In FIG. 5b, the backlight unit 200B may include a light diffusing and light enhancing sheet 231, a light guide plate 232, and a reflection plate 240. Here, the backlight unit 200B may include a light source (not shown) which is formed in the form of a linear light source or point light source and is disposed on the rear and/or side of the light guide plate 232. According to the embodiment, a support 233 may be further included on the edges of the light guide plate 232 and the light diffusing and light enhancing sheet 231.

The light guide plate 232 may generally convert lights from the light source (not shown) in the form of a linear light source or point light source into light from a light source in the form of a surface light source, and allow the light to proceed to the LCD panel 200A.

A part of the light emitted from the light guide plate 232 may be emitted to a side opposite to the LCD panel 200A and be lost. The reflection plate 240 may be positioned below the light guide plate 232 so as to cause the lost light to be incident again on the light guide plate 232, and may be made of a material having a high reflectance.

The light diffusing and light enhancing sheet 231 may include a diffuser sheet and/or a prism sheet. The diffuser sheet functions to diffuse the light incident from the light guide plate 232. For example, light scattered by the pattern of the light guide plate 232 comes directly into the eyes of the user, and thus, the pattern of the light guide plate 232 may be shown as it is. Moreover, since such a pattern can be clearly sensed even after the LCD panel 200A is mounted, the diffuser sheet is able to perform a function to offset the pattern of the light guide plate 232.

After the light passes through the diffuser sheet, the luminance of the light is rapidly reduced. Therefore, the prism sheet may be included in order to improve the luminance of the light by focusing the light again.

The backlight unit 200B may include a configuration different from the above-described configuration in accordance with the technical change and development and/or the embodiment. The backlight unit 200B may further include an additional configuration as well as the foregoing configuration. Also, in order to protect the optical configuration of the backlight unit 200B from external impacts and contamination, etc., due to the introduction of the alien substance, the backlight unit 200B according to the embodiment of the present may further include, for example, a protection sheet on the prism sheet. The backlight unit 200B may also further include a lamp cover in accordance with the embodiment so as to minimize the optical loss of the light source. The backlight unit 200B may also further include a frame which maintains a shape enabling the light diffusing and light enhancing sheet 231, the light guide plate 232, a lamp (not shown), and the like, which are main components of the backlight unit 200B, to be exactly combined together in accordance with an allowed dimension. Also, the each of the components may be comprised of at least two separate parts. For example, the prism sheet may include two prism sheets.

Here, a first air gap 220-2 may be positioned between the light guide plate 232 and the reflection plate 240. As a result, the lost light from the light guide plate 232 to the reflection plate 240 can be incident again on the light guide plate 232 by the reflection plate 240. Here, between the light guide plate 232 and the reflection plate 240, for the purpose of maintaining the first air gap 220-2, a display module frame 221-2 may be included on the edges of the light guide plate 232 and the reflection plate 240.

Also, according to the embodiment, the backlight unit 200B and the LCD panel 200A may be positioned with the second air gap 220-1 placed therebetween. This intends to prevent that the impact from the LCD panel 200A is transmitted to the backlight unit 200B. Here, between the backlight unit 200B and the LCD panel 200A, a display module frame 221-1 may be included on the edges of the LCD panel 200A and the backlight unit 200B so as to maintain the second air gap 220-1.

Here, the display module frames 221-1 and 221-2 may be made of an inelastic material. In the embodiment of the present invention, when a pressure is applied to the display module 200, the display module 200 may be bent. Therefore, the magnitude of the touch pressure can be detected by the change of the distance between the light diffusing and light enhancing sheet 231 and the LCD panel 200A or the distance between the light guide plate 232 and the reflection plate 240 even though the display module frames 221-1 and 221-2 are not deformed by the pressure.

As described above, the display module 200 may be configured to include in itself the air gap such as the first air gap 220-2 and/or the second air gap 220-1. Also, the air gap may be included between a plurality of the layers of the light diffusing and light enhancing sheet 231. In the foregoing, while the LCD module has been described, the air gap may be included within the structure of another display module.

Also, the touch input device 1000 according to the embodiment of the present invention may further include a cover member (not shown) under the display module 200. The cover member may be made of a metal for protecting the reflection plate 240 from contamination due to the introduction of the alien substance, external impacts, etc. In this case, the substrate 300 according to the embodiment of the present invention may be the cover member.

Figure 5C:
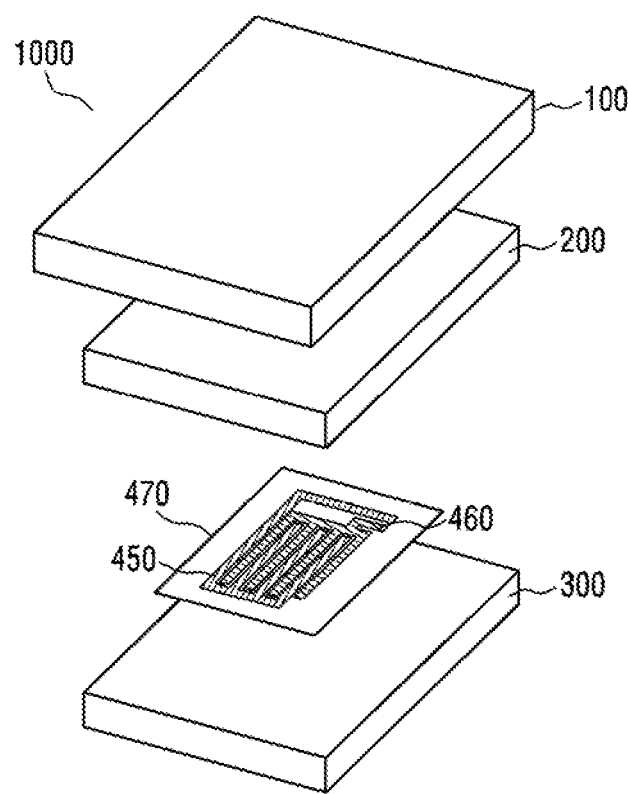

Therefore, for detecting the touch pressure, the touch input device 1000 according to the second example of the present invention may make use of the air gap which has been already positioned inside or outside the display module 200 without manufacturing a separate spacer layer. The air gap which is used as the spacer layer may be not only the first air gap 220-2 and/or the second air gap 220-1 which are described with reference to FIG. 5b but also any air gap included inside the display module 200. Also, the air gap which is used as the spacer layer may be an air gap included outside the display module 200. As such, the electrode sheet 440 capable of detecting the touch pressure is inserted into the touch input device 1000, so that the manufacturing cost can be reduced and/or the manufacturing process can be simplified. FIG. 5c is a perspective view of the touch input device according to the second example of the present invention. In FIG. 5c, unlike the first example shown in FIG. 4b, the frame 430 for maintaining the spacer layer 420 may not be included.

Figure 5D:
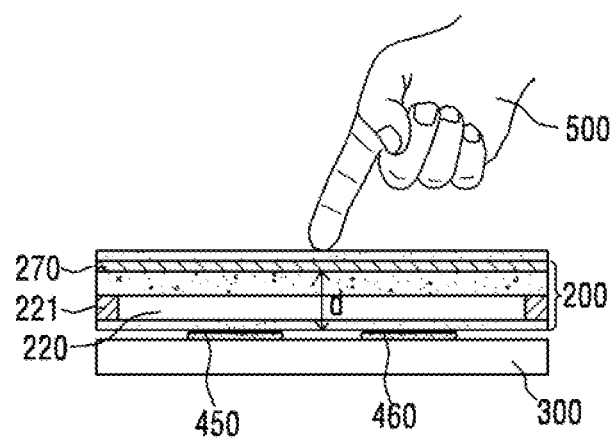
Figure 5E:
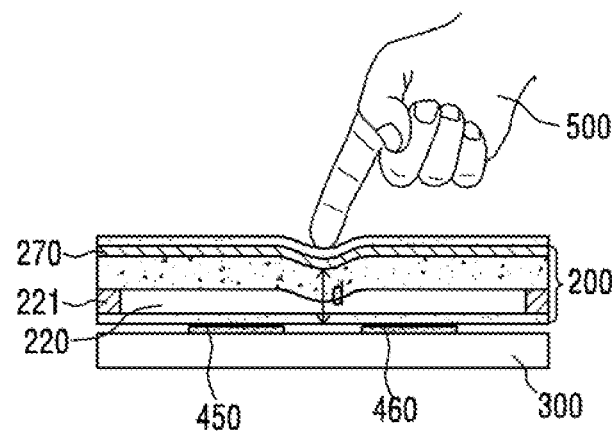

FIG. 5d is a cross sectional view of the touch input device according to the second example. As shown in FIG. 5d, between the display module 200 and the substrate 300, the electrode sheet 440 including the pressure electrodes 450 and 460 may be formed on the substrate 300. In FIGS. 5d to 5i, the pressure electrodes 450 and 460 are shown exaggeratedly thick for convenience of description. However, since the pressure electrodes 450 and 460 can be implemented in the form of a sheet, the thickness of the first electrode 450 and the second electrode 460 may be very small. Likewise, although a distance between the display module 200 and the substrate 300 is also shown exaggeratedly large, the display module 200 and the substrate 300 may be implemented to have a very small distance therebetween. FIGS. 5d and 5e show that the display module 200 and the pressure electrodes 450 and 460 are spaced apart from each other so as to represent that the electrode sheet 440 including the pressure electrodes 450 and 460 have been formed on the substrate 300. However, this is for description only. The display module 200 and the first and second electrodes 450 and 460 may not be spaced apart from each other.

Here, FIG. 5d shows that the display module 200 includes a spacer layer 220, the display module frame 221, and a reference potential layer 270.

The spacer layer 220 may be, as described with reference to FIG. 5b, the first air gap 220-2 and/or the second air gap 220-1 which are included during the manufacture of the display module 200. When the display module 200 includes one air gap, the air gap may function as the spacer layer 220. When the display module 200 includes a plurality of air gaps, the plurality of air gaps may collectively function as the spacer layer 220. FIGS. 5*d*, 5*e*, 5*h* and 5*i* show that the display module 200 functionally includes one spacer layer 220.

According to the second example of the present invention, the touch input device 1000 may include the reference potential layer 270 which is positioned above the spacer layer 220 within the display panel 200A of FIGS. 2*a* to 2*c*. The reference potential layer 270 may be a ground potential layer which is included in itself during the manufacture of the display module 200. For example, in the display panel 200A shown in FIGS. 2*a* to 2*c*, an electrode (not shown) for blocking the noise may be included between the first polarizer layer 271 and the first glass layer 261. The electrode for blocking the noise may be composed of ITO and may function as the ground. Within the display module 200, the reference potential layer 270 may be located at any position causing the spacer layer 220 to be placed between the reference potential layer 270 and the pressure electrodes 450 and 460. Not only the above-described blocking electrode but also an electrode having any potential may be used as the reference potential layer 270. For example, the reference potential layer 270 may be a common electrode potential (Vcom) layer of the display module 200.

Particularly, as part of an effort to reduce the thickness of the device including the touch input device 1000, the display module 200 may not be surrounded by a separate cover or frame. In this case, the bottom surface of the display module 200, which faces the substrate 300, may be the reflection plate 240 and/or a nonconductor. In this case, the bottom surface of the display module 200 cannot have the ground potential. As mentioned, even when the bottom surface of the display module 200 cannot function as the reference potential layer, it is possible to detect the touch pressure by using any potential layer positioned within the display module 200 as the reference potential layer 270 through use of the touch input device 1000 according to the second example.

FIG. 5*e* is a cross sectional view of a case where a pressure has been applied to the touch input device 1000 shown in FIG. 5*d*. When the pressure is applied to the surface of the touch sensor panel 100 by the object 500, the touch sensor panel 100 or the display module 200 may be bent or pressed. Here, a distance "d" between the reference potential layer 270 and the pressure electrode 450 and 460 may be decreased to "d'" by the spacer layer 220 positioned within the display module 200. In this case, due to the decrease of the distance "d", the fringing capacitance is absorbed in the reference potential layer 270, so that the mutual capacitance between the first electrode 450 and the second electrode 460 may be reduced. Therefore, the magnitude of the touch pressure can be calculated by obtaining the reduction amount of the mutual capacitance from the sensing signal obtained through the receiving electrode.

Here, the display module frame 221 may be made of an inelastic material. In the embodiment of the present invention, when a pressure is applied to the display module 200, the display module 200 may be bent. Therefore, the magnitude of the touch pressure can be detected by the change of the distance between the reference potential layer 270 and the pressure electrodes 450 and 460 even though the display module frame 221 is not deformed by the pressure.

In the touch sensor panel 100 according to the second example of the present invention, the display module 200 may be bent or pressed by the touch pressure. Here, as shown in FIG. 5*e*, due to the spacer layer 220, the layer positioned below the spacer layer 220 (e.g., the reflection plate) may not be bent or pressed or may be less bent or pressed. While FIG. 5*e* shows that the lowest portion of the display module 200 is not bent or pressed at all, this is just an example. The lowest portion of the display module 200 may be bent or pressed. However, the degree to which the lowest portion of the display module 200 is bent or pressed can be reduced by the spacer layer 220.

Since the structure of the electrode sheet 440 including the pressure electrode according to the second example and how to attach the electrode sheet 440 are the same as those described with reference to the first example, the description thereof will be omitted.

Figure 5F:
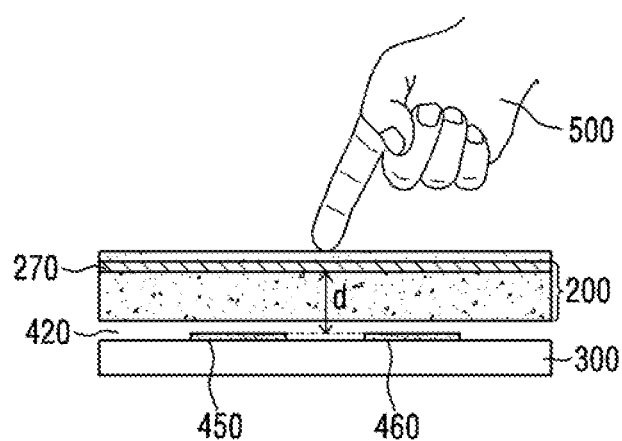
Figure 5G:
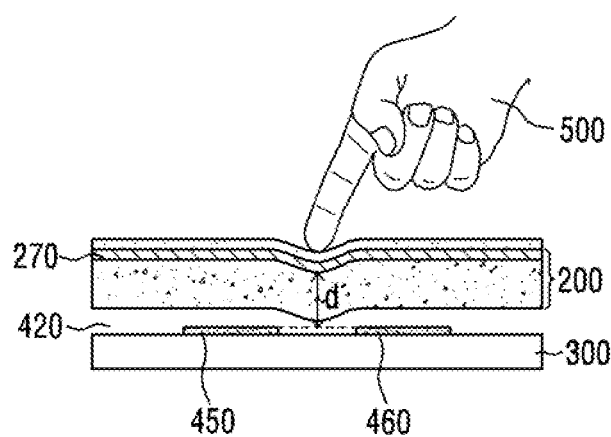

FIG. 5*f* is a cross sectional view of the touch input device including the pressure electrode according to the modification of the embodiment described with reference to FIG. 5*d*. FIG. 5*f* shows that the spacer layer 220 is positioned between the display module 200 and the substrate 300. When the touch input device 1000 including the display module 200 is manufactured, the display module 200 is not completely attached to the substrate 300, so that the air gap 420 may be created. Here, by using the air gap 420 as the spacer layer for detecting the touch pressure, it is possible to reduce the time and cost intentionally required for manufacturing the spacer layer for detecting the touch pressure. FIGS. 5*f* and 5*g* show that the spacer layer 420, i.e., the air gap is not positioned within the display module 200. However, FIGS. 5*f* and 5*g* may additionally include a case where the spacer layer 220 is positioned within the display module 200.

FIG. 5*g* is a cross sectional view of a case where a pressure has been applied to the touch input device shown in FIG. 5*f*. As with FIG. 5*d*, when the touch occurs on the touch input device 1000, the display module 200 may be bent or pressed. Here, the "d" between the reference potential layer 270 and the pressure electrode 450 and 460 may be decreased to "d'" by the spacer layer 420 which is positioned between the reference potential layer 270 and the pressure electrodes 450 and 460. As a result, the magnitude of the touch pressure can be calculated by obtaining the reduction amount of the mutual capacitance from the sensing signal obtained through the receiving electrode.

Here, though not shown in FIG. 5*g*, a frame for maintaining the distance between the display module 200 and the substrate 300 may be formed on the edge of the display module 200 or the substrate 300. Here, the frame may be made of an inelastic material. In the embodiment of the present invention, when a pressure is applied to the display module 200, the display module 200 may be bent. Therefore, the magnitude of the touch pressure can be detected by the change of the distance between the reference potential layer 270 and the pressure electrodes 450 and 460 even though the frame is not deformed by the pressure.

Figure 5H:
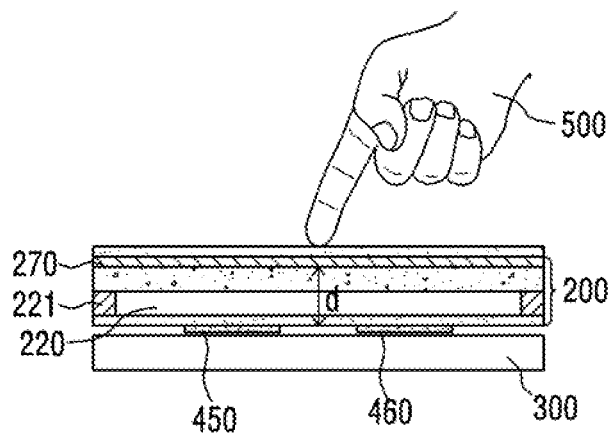

FIG. 5*h* shows that the electrode sheet 440 including the pressure electrodes 450 and 460 is disposed on the bottom surface of the display module 200. The distance "d" between the reference potential layer 270 and the pressure electrodes 450 and 460 is reduced by touching the touch surface of the touch sensor panel 100. Consequently, this may cause the change of the mutual capacitance between the first electrode 450 and the second electrode 460. FIG. 5*h* shows that the substrate 300 and the pressure electrodes 450 and 460 are spaced apart from each other so as to describe that the pressure electrodes 450 and 460 are attached on the display module 200. However, this is for description only. The substrate 300 and the pressure electrodes 450 and 460 may not be spaced apart from each other. Also, as with FIGS. 5*f* and 5*g*, the display module 200 and the substrate 300 may be spaced apart from each other by the spacer layer 420.

Similarly to the first example, the pressure electrodes 450 and 460 described with reference to FIGS. 5*d* to 5*h* according to the second example may also have the pattern shown in FIGS. 7*a* to 7*c*, and repetitive descriptions thereof will be omitted.

Figure 5I:
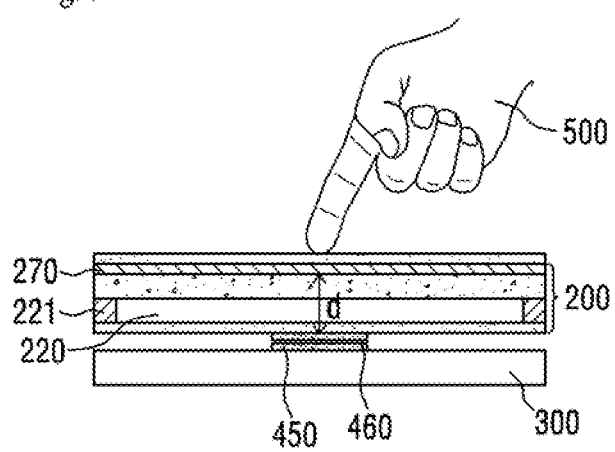

FIG. 5*i* shows that the first electrode sheet 440-1 and the second electrode sheet 440-2, each of which includes the pressure electrode 450 and the pressure electrode 460 respectively, are disposed on the top surface of the substrate 300 and on the bottom surface of the display module 200 respectively. FIG. 5*i* shows that the first electrode 450 is formed on the substrate 300, and the second electrode 460 is formed on the bottom surface of the display module 200. FIG. 5*i* shows that the first electrode 450 is spaced apart from the second electrode 460. However, this is just intended to describe that the first electrode 450 is formed on the substrate 300 and the second electrode 460 is formed on the display module 200. The first electrode 450 and the second electrode 460 may be spaced apart from each other by the air gap, may have an insulating material placed therebetween, or may be formed to deviate from each other, for example, may be formed in the same layer, not to be overlapped with each other.

When the pressure is applied to the surface of the touch sensor panel 100 by the object 500, the touch sensor panel 100 and the display module 200 may be bent or pressed. As a result, the distance "d" between the pressure electrodes 450 and 460 and the reference potential layer 270 may be reduced. In this case, the mutual capacitance between the first electrode 450 and the second electrode 460 may be reduced with the reduction of the distance "d". Therefore, the magnitude of the touch pressure can be calculated by obtaining the reduction amount of the mutual capacitance from the sensing signal obtained through the receiving electrode. Here, the first electrode 450 and the second electrode 460 may have the pattern shown in FIG. 7*e*. As shown in FIG. 7*e*, the first electrode 450 and the second electrode 460 are disposed perpendicular to each other, so that the capacitance change amount detection sensitivity can be enhanced.

FIGS. 6*a* to 6*h* show a touch input device according to a third example of the present invention. The third example is similar to the first example. The following description will focus on differences between them.

Figure 6A:
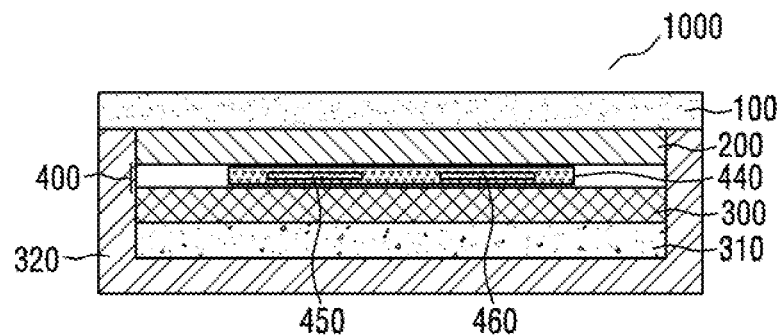
FIGS. 6a to 6h show a third example in which the electrode sheet according to the embodiment of the present invention is applied to the touch input device.

FIG. 6*a* is a cross sectional view of the touch input device according to the third example of the present invention. In the third example, the electrode sheet 440 including the pressure electrodes 450 and 460 included in the pressure detection module 400 may be inserted into the touch input device 1000. Here, FIG. 6*a* shows that the electrode sheet 440 including the pressure electrodes 450 and 460 is disposed apart from the substrate 300 and the display module 200. However, the electrode sheet 440 including the pressure electrodes 450 and 460 may be formed to contact any one of the substrate 300 and the display module 200.

In the touch input device 1000 according to the third example of the present invention, for the purpose of detecting the touch pressure, the electrode sheet 440 may be attached to the display module 200 such that the electrode sheet 440 and either the substrate 300 or the display module 200 are spaced apart from each other with the spacer layer 420 placed therebetween.

Figure 6B:
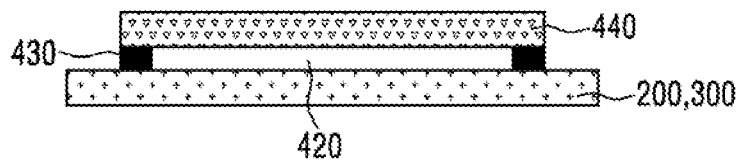

FIG. 6*b* is a partial cross sectional view of the touch input device including the electrode sheet 440 attached thereto according to a first method. FIG. 6*b* shows that the electrode sheet 440 has been attached on the substrate 300 or the display module 200.

Figure 6C:
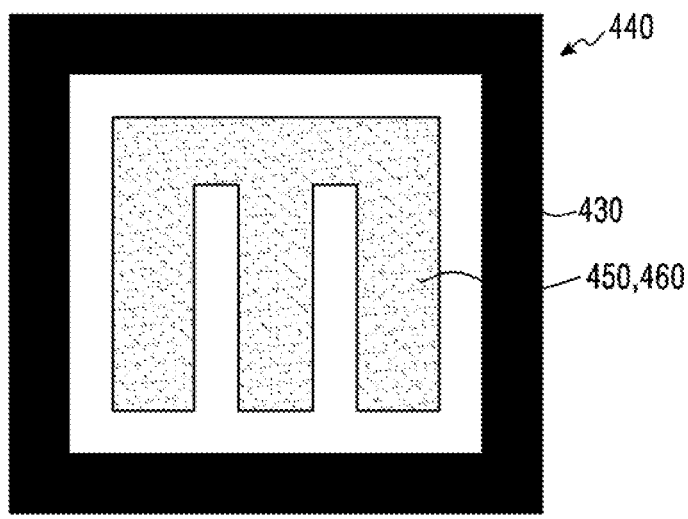

As shown in FIG. 6*c*, the frame 430 with a predetermined thickness may be formed along the border of the electrode sheet 440 in order to maintain the spacer layer 420. While FIG. 6*c* shows the frame 430 is formed on the entire border (e.g., four sides of the quadrangle) of the electrode sheet 440, the frame 430 may be formed only on at least some (e.g., three sides of the quadrangle) of the border of the electrode sheet 440. Here, as shown in FIG. 6*c*, the frame 430 may not formed in an area including the electrode patterns 450 and 460. As a result, when the electrode sheet 440 is attached to the substrate 300 of the display module 200 by the frame 430, the pressure electrodes 450 and 460 may be spaced apart from the substrate 300 of the display module 200 by a predetermined distance. According to the embodiment, the frame 430 may be formed on the top surface of the substrate 300 or on the bottom surface of the display module 200. Also, the frame 430 may be a double adhesive tape. FIG. 6*c* shows that the electrode sheet 440 includes only one out of the pressure electrodes 450 and 460.

Figure 6D:
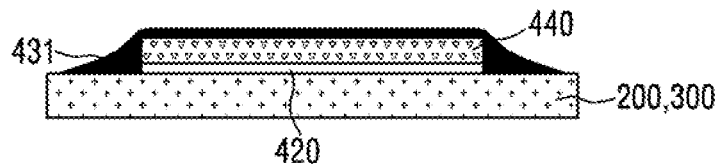

FIG. 6*d* is a partial cross sectional view of the touch input device including the electrode sheet attached thereto according to a second method. In FIG. 6*d*, after the electrode sheet 440 is positioned on the substrate 300 or the display module 200, the electrode sheet 440 can be fixed to the substrate 300 or the display module 200 by means of an adhesive tape 431. For this, the adhesive tape 431 may contact at least a portion of the electrode sheet 440 and at least a portion of the substrate 300 or the display module 200. FIG. 6*d* shows that the adhesive tape 431 continues from the top of the electrode sheet 440 to the exposed surface of the substrate 300 or the display module 200. Here, only the surface of the adhesive tape 431, the surface contacting the electrode sheet 440, may have an adhesive strength. Accordingly, in FIG. 6*d*, the top surface of the adhesive tape 431 may have no adhesive strength.

As shown in FIG. 6*d*, even though the electrode sheet 440 is fixed to the substrate 300 or the display module 200 by the adhesive tape 431, a predetermined space, i.e., the air gap may be created between the electrode sheet 440 and either the substrate 300 or the display module 200. This is because the electrode sheet 440 is not directly attached to either the substrate 300 or the display module 200 by an adhesive and because the electrode sheet 440 includes the pressure electrodes 450 and 460 having a pattern, so that the surface of the electrode sheet 440 may not be flat. The air gap 420 of FIG. 6*d* may also function as the spacer layer 420 for detecting the touch pressure.

In the following description, the third example has been described with reference to a case where the electrode sheet 440 is attached t to the substrate 300 or the display module 200 by the first method shown in FIG. 6*b*. However, the description can be applied to a case where the electrode sheet 440 is attached and spaced from the substrate 300 or the display module 200 by any method like the second method, etc.

Figure 6E:
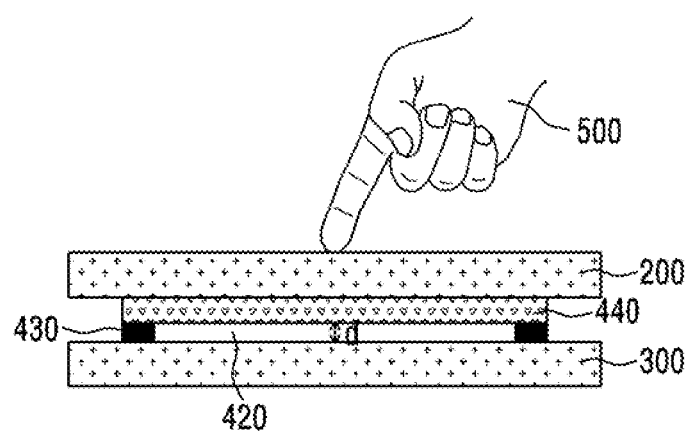

FIG. 6*e* is a cross sectional view of the touch input device including the pressure electrode pattern according to the third example of the present invention. As shown in FIG. 6*e*, the electrode sheet 440 including the pressure electrodes 450 and 460 may be attached to the substrate 300 such that, particularly, the area where the pressure electrodes 450 and 460 have been formed is spaced from the substrate 300 by the spacer layer 420. While FIG. 6*e* shows that the display module 200 contacts the electrode sheet 440, this is just an example. The display module 200 may be positioned apart from the electrode sheet 440.

Figure 6F:
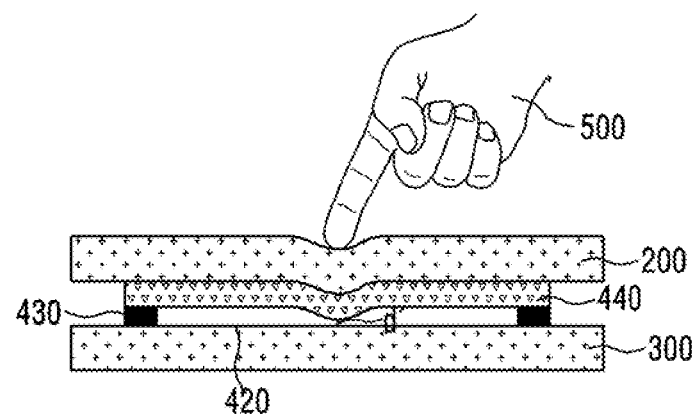

FIG. 6f is a cross sectional view of a case where a pressure has been applied to the touch input device 1000 shown in FIG. 6e. The substrate 300 may have a ground potential so as to block the noise. When the pressure is applied to the surface of the touch sensor panel 100 by the object 500, the touch sensor panel 100 and the display module 200 may be bent or pressed. As a result, the electrode sheet 440 is pressed, so that the distance "d" between the substrate 300 and the pressure electrodes 450 and 460 included in the electrode sheet 440 may be decreased to "d'". In this case, due to the decrease of the distance "d", the fringing capacitance is absorbed in the substrate 300, so that the mutual capacitance between the first electrode 450 and the second electrode 460 may be reduced. Therefore, the magnitude of the touch pressure can be calculated by obtaining the reduction amount of the mutual capacitance from the sensing signal obtained through the receiving electrode.

As shown in FIGS. 6e and 6f, the touch input device 1000 according to the third example of the present invention is able to detect the touch pressure by the distance change between the electrode sheet 440 and the substrate 300 to which the electrode sheet 440 has been attached. Here, since the distance "d" between the electrode sheet 440 and the substrate 300 is very small, the touch input device 1000 is able to precisely detect the touch pressure even by the minute change in the distance "d" due to the touch pressure.

Figure 6G:
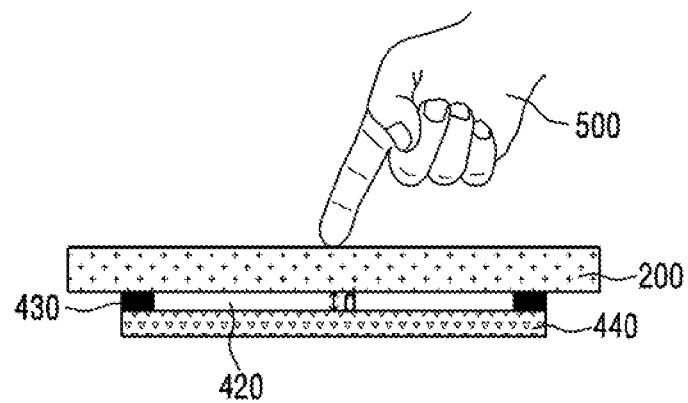
Figure 6H:
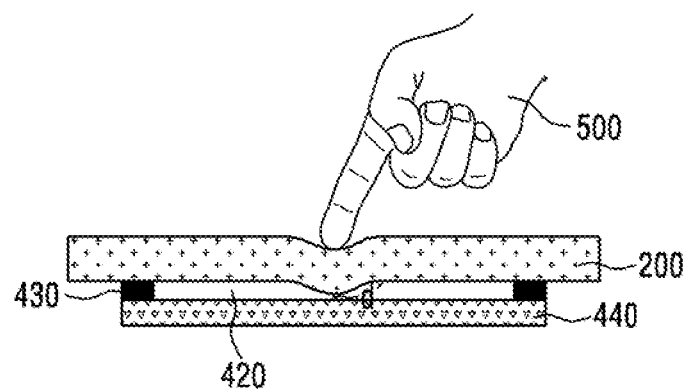

FIG. 6g shows that the pressure electrodes 450 and 460 are attached to the bottom surface of the display module 200. FIG. 6h is a cross sectional view of a case where a pressure has been applied to the touch input device shown in FIG. 6g. Here, the display module 200 may have the ground potential. Therefore, a distance "d" between the display module 200 and the pressure electrodes 450 and 460 is reduced by touching the touch surface of the touch sensor panel 100. Consequently, this may cause the change of the mutual capacitance between the first electrode 450 and the second electrode 460.

As shown in FIGS. 6g and 6h, it can be understood that the touch input device 1000 according to the third example of the present invention can also detect the touch pressure by a distance change between the electrode sheet 440 and the display module 200 to which the electrode sheet 440 has been attached.

For example, the distance between the display module 200 and the electrode sheet 440 may be less than the distance between the electrode sheet 440 and the substrate 300. Also, for example, the distance between the electrode sheet 440 and the bottom surface of the display module 200 having the ground potential may be less than the distance between the electrode sheet 440 and the Vcom potential layer and/or any ground potential layer. For example, in the display panel 200 shown in FIGS. 2a to 2c, an electrode (not shown) for blocking the noise may be included between the first polarizer layer 271 and the first glass layer 261. The electrode for blocking the noise may be composed of ITO and may function as the ground.

Figure 7A:
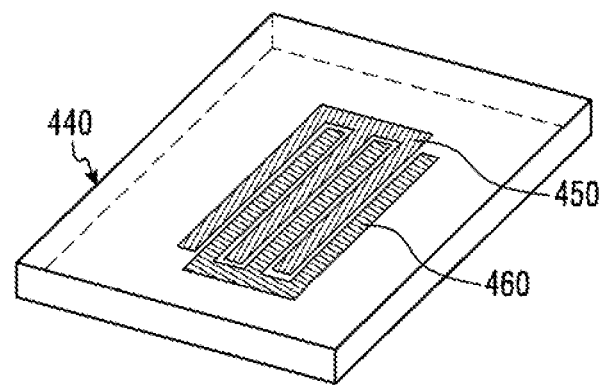
FIGS. 7a to 7e show pressure electrode patterns included in the electrode sheet for detecting a pressure in accordance with the embodiment of the present invention.
Figure 7B:
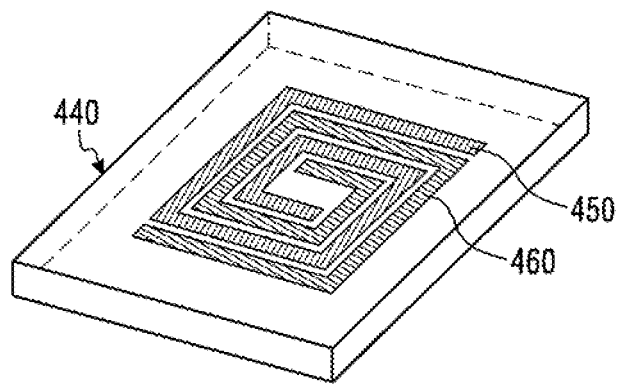
Figure 7C:
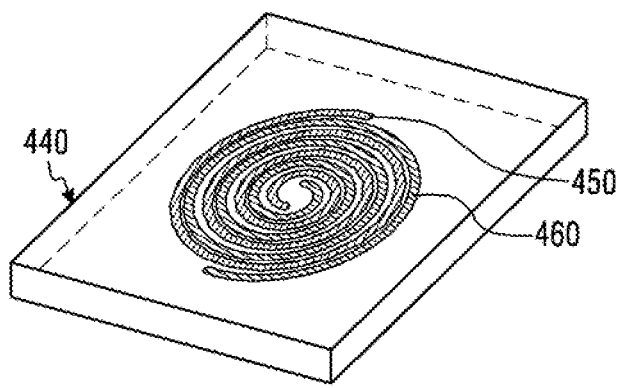
Figure 7D:
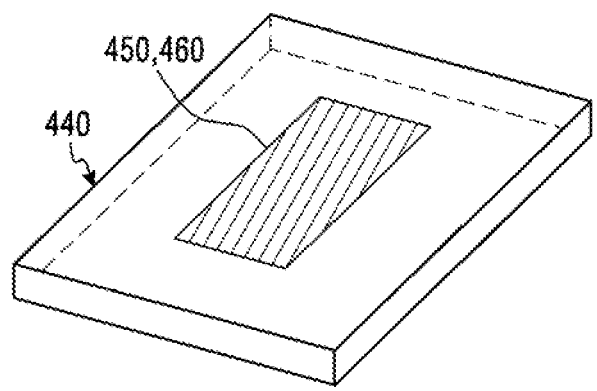
Figure 7E:
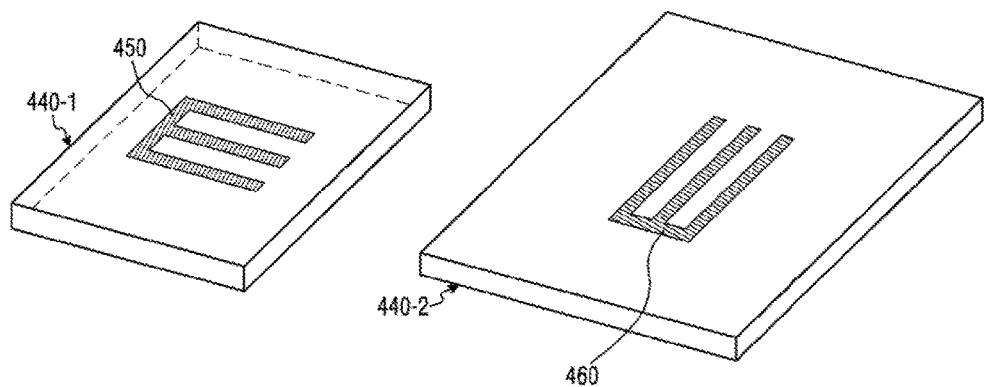

The first electrode 450 and the second electrode 460 which are included in FIGS. 6e to 6h may have the pattern shown in FIGS. 7a to 7c, and repetitive descriptions thereof will be omitted.

In FIGS. 6a to 6h, it is shown that the first electrode 450 and the second electrode 460 are formed in the same layer. However, it can be considered that the first electrode 450 and the second electrode 460 are formed in different layers in accordance with the embodiment. As shown in FIG. 9b, in the electrode sheet 440, the first electrode 450 may be formed on the first insulation layer 470, and the second electrode 460 may be formed on the second insulation layer 471 positioned on the first electrode 450. The second electrode 460 may be covered with the third insulation layer 472.

Also, according to the embodiment, the pressure electrodes 450 and 460 may be configured to include only any one of the first electrode 450 and the second electrode 460. In this case, it is possible to detect the magnitude of the touch pressure by detecting the change of the capacitance between the one pressure electrode and the ground layer (either the display module 200 or the substrate 300), that is to say, the self-capacitance. Here, the pressure electrode may have, as shown in FIG. 7d, a plate shape (e.g., quadrangular plate). Here, as shown in FIG. 9c, in the electrode sheet 440, the first electrode 450 may be formed on the first insulation layer 470 and may be covered with the third insulation layer 472.

Figure 8A:
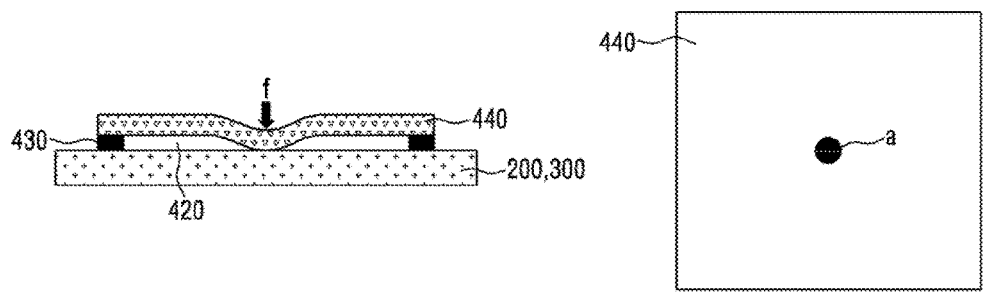
FIGS. 8a and 8b show a relation between a magnitude of a touch pressure and a saturated area in the touch input device to which the electrode sheet has been applied according to the embodiment of the present invention.
Figure 8B:
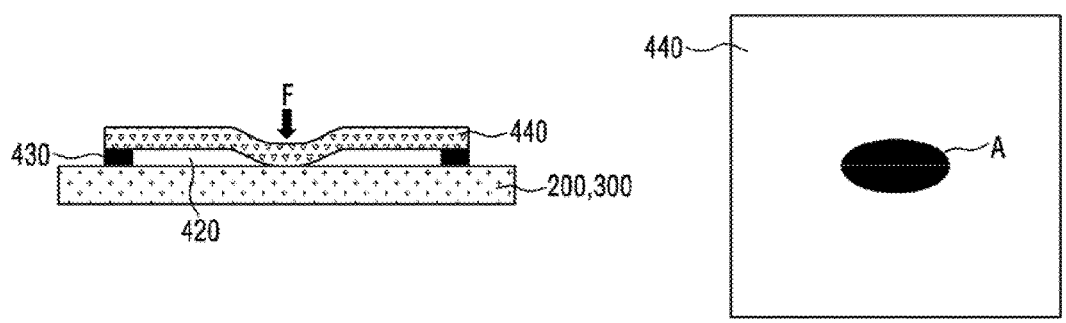

FIGS. 8a and 8b show a relation between the magnitude of the touch pressure and a saturated area in the touch input device to which the electrode sheet 440 has been applied according to the embodiment of the present invention. Although FIGS. 8a and 8b show that the electrode sheet 440 is attached to the substrate 300, the following description can be applied in the same manner to a case where the electrode sheet 440 is attached to the display module 200.

The touch pressure with a sufficient magnitude makes a state where the distance between the electrode sheet 440 and the substrate 300 cannot be reduced any more at a predetermined position. Hereafter, the state is designated as a saturation state. For instance, as shown in FIG. 8a, when the touch input device 1000 is pressed by a force "f", the electrode sheet 440 contacts the substrate 300, and thus, the distance between the electrode sheet 440 and the substrate 300 cannot be reduced any more. Here, as shown on the right of FIG. 8a, the contact area between the electrode sheet 440 and the substrate 300 may be indicated by "a".

However, in this case, when the magnitude of the touch pressure becomes larger, the contact area between the electrode sheet 440 and the substrate 300 in the saturation state where the distance between the electrode sheet 440 and the substrate 300 cannot be reduced any more may become greater. For example, as shown in FIG. 8b, when the touch input device 1000 is pressed by a force "F" greater than the force "f", the contact area between the electrode sheet 440 and the substrate 300 may become greater. As shown on the right of FIG. 8a, the contact area between the electrode sheet 440 and the substrate 300 may be indicated by "A". As such, the greater the contact area, the more the mutual capacitance between the first electrode 450 and the second electrode 460 may be reduced. Hereafter, it will be described that the magnitude of the touch pressure is calculated by the change of the capacitance according to the distance change. This may include that the magnitude of the touch pressure is calculated by the change of the saturation area in the saturation state.

FIGS. 8a and 8b are described with reference to the third example. It is apparent that the description with reference to FIGS. 8a and 8b can be applied in the same manner to the first to second examples and the following fourth example. More specifically, the magnitude of the touch pressure can be calculated by the change of the saturation area in the saturation state where the distance between the pressure electrodes 450 and 460 and either the ground layer or the reference potential layer 200, 300, and 270 cannot be reduced any more.

Figure 10A:
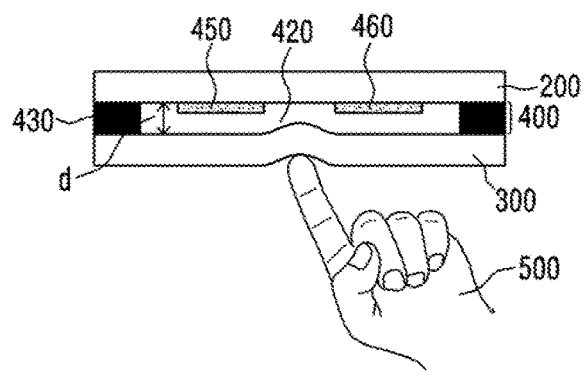
FIGS. 10a and 10b show a fourth example in which the electrode sheet according to the embodiment of the present invention is applied to the touch input device.
Figure 10B:
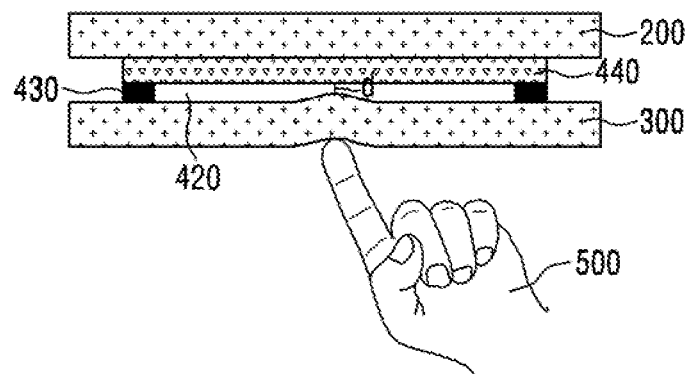

FIGS. 10a and 10b show a touch input device according to a fourth example of the present invention. The touch input device 1000 according to the fourth example of the present invention can sense the touch pressure by inserting the electrode sheet 440 even when the pressure is applied to the bottom surface as well as the top surface of the touch input device. In this specification, the top surface of the touch input device 1000 as the touch surface may be designated as the top surface of the display module 200 and may include not only the top surface of the display module 200 but also the surface of a member covering the top surface of the display module 200. Also, in this specification, the bottom surface of the touch input device 1000 as the touch surface may be designated as the bottom surface of the substrate 300 and may include not only the bottom surface of the substrate 300 but also the surface of a member covering the bottom surface of the substrate 300.

FIG. 10*a* shows that the electrode sheet 440 including the pressure electrodes 450 and 460 is positioned on the bottom surface of the display module 200 in the first example. FIG. 10*a* shows that the distance between the substrate 300 and the pressure electrodes 450 and 460 is changed when the substrate 300 is pressed or bent by applying a pressure to the bottom surface of the substrate 300. Here, as the distance between the pressure electrodes 450 and 460 and the substrate 300, i.e., the reference potential layer is changed, the capacitance between the first electrode 450 and the second electrode 460 or the capacitance between the substrate 300 and either the first electrode 450 or the second electrode 460 is changed. Accordingly, the touch pressure can be detected.

FIG. 10*b* shows that the electrode sheet 440 is attached to the substrate 300 in the third example. FIG. 10*b* shows that the distance between the substrate 300 and the electrode sheet 440 is changed when the substrate 300 is pressed or bent by applying a pressure to the bottom surface of the substrate 300. As with the case of FIG. 10*a*, as the distance between the pressure electrodes 450 and 460 and the substrate 300, i.e., the reference potential layer is changed, the capacitance between the first electrode 450 and the second electrode 460 or the capacitance between the substrate 300 and either the first electrode 450 or the second electrode 460 is changed. Accordingly, the touch pressure can be detected.

In FIGS. 10*a* and 10*b*, while the fourth example has been described based on the structures of some of the first and third examples, the fourth example can be applied to a case where the substrate 300 is bent or pressed by applying a pressure to the bottom surface of the substrate 300 included in the structures of the first to the third examples, so that the capacitance between the first electrode 450 and the second electrode 460 is changed or the capacitance between the first electrode 450 and the reference potential layer 200, 300, and 270 is changed. For example, in the structure shown in FIG. 4*c*, when the substrate 300 is bent or pressed, the distance between the display module 200 and the pressure electrodes 450 and 460 may be changed, thereby detecting the touch pressure.

As shown in FIGS. 4 to 10, in a state where the electrode sheet 440 according to the embodiment of the present invention is attached to the touch input device, the magnitude of the touch pressure is obtained from the change amount of the capacitance detected from the pressure electrodes 450 and 460. Here, the capacitance detected from the pressure electrodes 450 and 460 has a poor accuracy because the capacitance is changed by the change of ambient environment including temperature as well as by the distance change between the reference potential layer and the pressure electrodes 450 and 460. Particularly, due to the external temperature change, the heat generation of the battery, etc., the temperature of the pressure electrodes 450 and 460 may significantly change. Therefore, only when it is possible to detect only the capacitance change amount due to the distance change between the reference potential layer and the pressure electrodes 450 and 460 except for the capacitance change amount due to the change of the ambient environment including temperature among the change amount of the detected capacitance, the magnitude of the touch pressure can be accurately detected.

To this end, a reset process can be intended to be repeatedly performed whenever a scan in which the driving signal is applied to the pressure electrodes 450 and 460 and the sensing signal is received from the pressure electrodes 450 and 460 is performed, or in a predetermined cycle. The reset process resets a reference capacitance to a reset time. This reset process is loaded on the touch sensing IC 150 in the form of software and is carried out. Since the reset process should be carried out at a time different from a driving signal application time interval and a sensing signal reception time interval which are for detecting the touch pressure, the efficiency of the touch pressure detection may be deteriorated. Also, when input touch is maintained without being released, the reset process is not carried out during the period during which the input touch is maintained. Therefore, the capacitance change due to the temperature change during the period during which the input touch is maintained cannot be excluded.

Figure 3B:
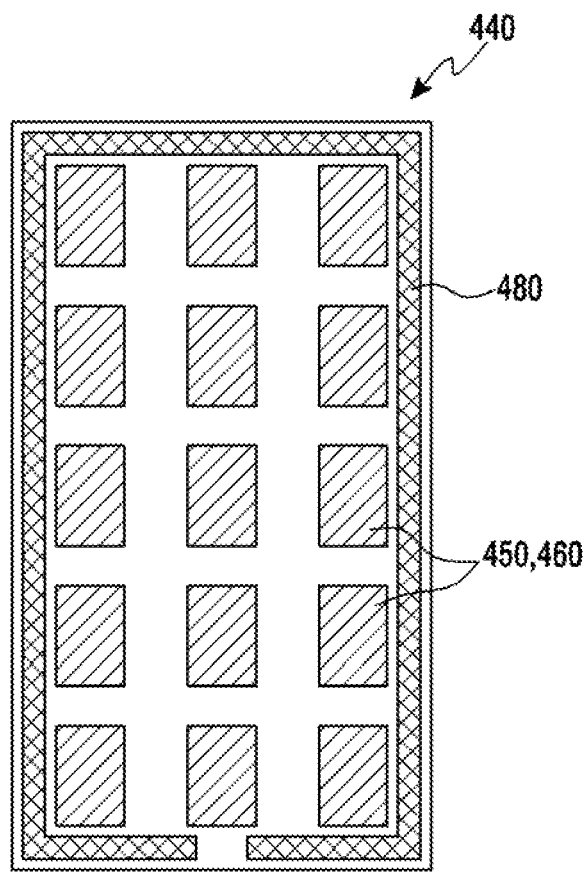
FIGS. 3b and 3g to 3i are exemplary plan views of an electrode sheet including the pressure electrode and a reference pressure electrode according to the embodiment of the present invention.

As shown in FIG. 3*b*, the electrode sheet 440 according to the embodiment of the present invention may include the pressure electrodes 450 and 460 and a reference pressure electrode 480. This reference pressure electrode 480 can be placed at a position where there is no distance change between the reference potential layer and the reference pressure electrode 480 or the distance change between the reference potential layer and the reference pressure electrode 480 is relatively very small even though the touch pressure is applied. Therefore, the capacitance which is detected at the reference pressure electrode 480 is mainly changed only in accordance with the change of the ambient environment including temperature. Here, by using the capacitance detected at the pressure electrodes 450 and 460 and the capacitance detected at the reference pressure electrode 480, the magnitude of the pressure which is applied to the touch surface can be calculated. The magnitude of the pressure which is applied to the touch surface can be calculated on the basis of a capacitance change amount ($\Delta C_{m\_press}$) due to a pure pressure. The capacitance change amount ($\Delta C_{m\_press}$) due to a pure pressure can be obtained by the following equation through use of the capacitance ($C_{m\_press\_electrode}$) detected at the pressure electrodes 450 and 460 and the capacitance ($C_{m\_reference\_electrode}$) detected at the reference pressure electrode 480.

$$\Delta C_{m\_press} = \alpha 1 \times C_{m\_press\_electrode} - \alpha 2 \times C_{m\_reference\_electrode}$$

Here, $\alpha 1$ and $\alpha 2$ may be constants to compensate for the fundamental difference between the capacitance detected at the pressure electrodes 450 and 460 used to detect the pressure and the capacitance detected at the reference pressure electrode 480. Specifically, since the capacitance is proportional to the area of the electrode, $\alpha 2/\alpha 1$ may be a ratio of the area of the pressure electrodes 450 and 460 used to detect the pressure to the area of the reference pressure electrode 480.

That is, the magnitude of the pressure which is applied to the touch surface can be calculated from the difference between a reference capacitance ($\alpha 2 \times C_{m\_reference\_electrode}$) calculated from the capacitance detected at the reference pressure electrode 480 and a detected capacitance ($\alpha 1 \times$ $C_{m\_press\_electrode}$) calculated from the capacitance detected at the pressure electrodes 450 and 460 used to detect the pressure. Here, α1 and α2 may have a value of 1.

Figure 3C:
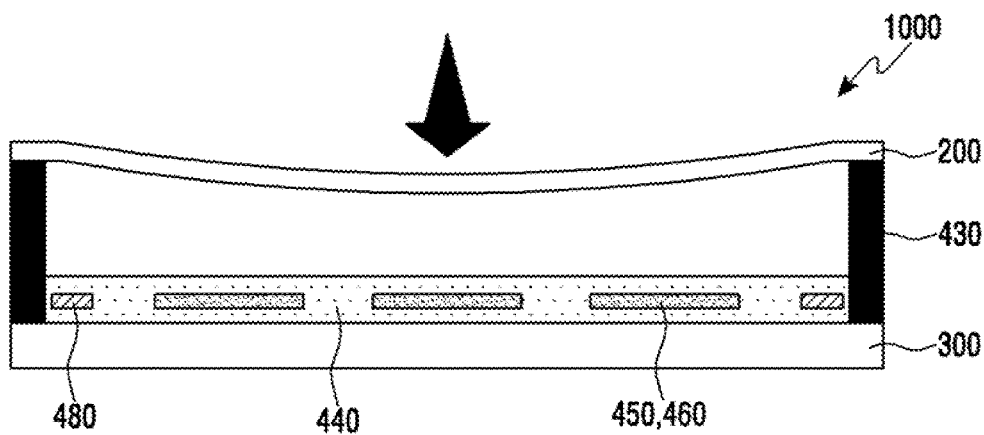
FIGS. 3c to 3f are exemplary cross sectional views of the touch input device including the pressure electrode and the reference pressure electrode according to the embodiment of the present invention.

Specifically, as shown in FIGS. 3*b* to 3*h*, the reference pressure electrode 480 according to the embodiment of the present invention may be disposed on the outside of the pressure electrodes 450 and 460. In this case, as shown in FIG. 3*c*, when the pressure is applied to the touch surface, the distance change between the reference pressure electrode 480 and reference potential layer is less than the distance change between the reference potential layer and the pressure electrodes 450 and 460 disposed under the position where the pressure is applied. Therefore, the change amount of the capacitance which is detected at the reference pressure electrode 480 in accordance with the distance change between the reference pressure electrode 480 and the reference potential layer is less than the change amount of the capacitance which is detected at the pressure electrodes 450 and 460 in accordance with the distance change between the pressure electrodes 450 and 460 and the reference potential layer.

Also, the reference pressure electrode 480 may be disposed under the area where the screen of the touch input device 1000 is not displayed. When the reference pressure electrode 480 is disposed under the area where the screen of the touch input device 1000 is not displayed, the touch input is not recognized in the area where the reference pressure electrode 480 is located, that is to say, the area where the screen is not displayed. Therefore, the capacitance detected at the pressure electrode 480 may not include the capacitance change caused by the touch pressure.

Also, the reference pressure electrode 480 may be disposed under the area where the position of the touch input to the touch input device 1000 is not sensed. Specifically, the reference pressure electrode 480 may be disposed under an area other than the area where the drive electrode TX or the receiving electrode RX included in the touch sensor panel 100 shown in FIG. 1 is disposed. Also, the reference pressure electrode 480 may be disposed under a bezel area where a conductive trace which connects the drive electrode TX or the receiving electrode RX with the touch sensing IC 150 is disposed. Likewise, when the reference pressure electrode 480 may be disposed under the area where the position of the touch input to the touch input device 1000 is not sensed, the touch input is not recognized in the area where the reference pressure electrode 480 is located. Therefore, the capacitance detected at the pressure electrode 480 may not include the capacitance change caused by the touch pressure.

Figure 3D:
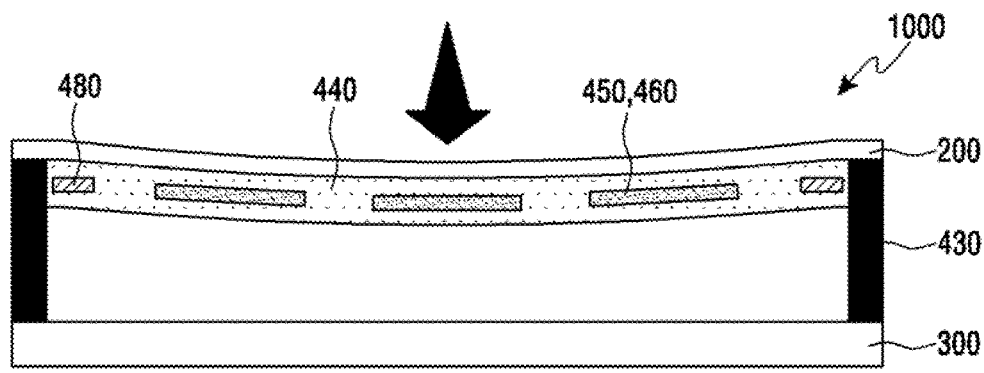
Figure 3E:
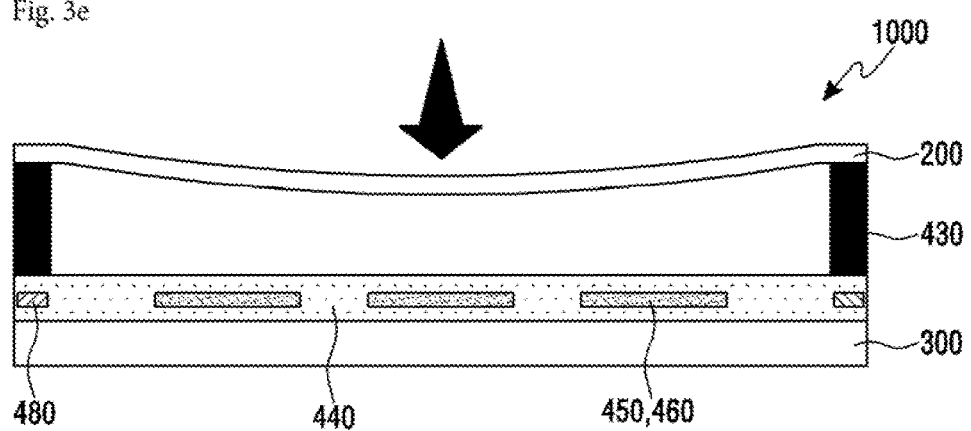
Figure 3F:
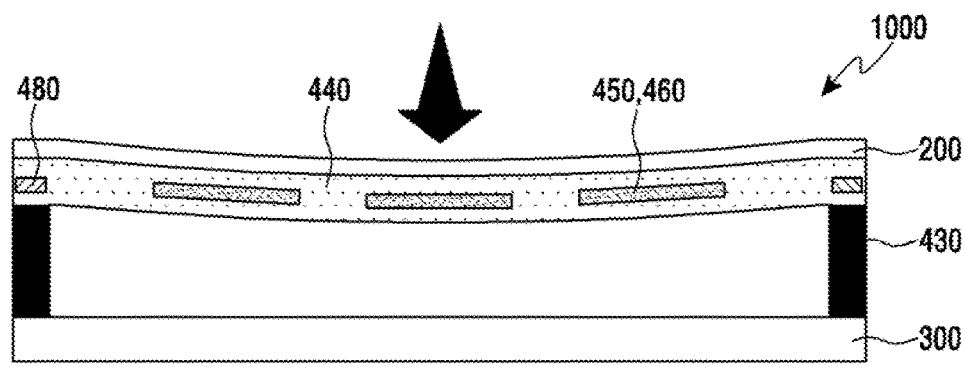

The frame 430 which is disposed at the border of the touch input device 1000 and causes the pressure electrodes 450 and 460 and the reference potential layer to be spaced apart from each other can be made of an inelastic material. Therefore, even when the pressure is applied to the display module 200, the frame 430 is not deformed or is deformed very slightly according to the pressure. Accordingly, when the reference pressure electrode 480 is, as shown in FIGS. 3*b* to 3*h*, disposed only at the border of the touch input device 1000, the capacitance which is detected at the reference pressure electrode 480 is mainly changed only in accordance with the change of the ambient environment including temperature because there is no distance change between the reference pressure electrode 480 and the reference potential layer or the distance change between the reference pressure electrode 480 and the reference potential layer is relatively very small even though the touch pressure is applied. Specifically, as shown in FIGS. 3*c* and 3*d*, the reference pressure electrode 480 may be disposed at a position adjacent to the frame 430. Further, as shown in FIGS. 3*e* and 3*f*, the reference pressure electrode 480 may be disposed on or under the frame 430.

The foregoing has described, as shown in FIG. 4*a* to 4*e*, 6*a* to 6*h*, or 8*a* to 8*b*, the touch input device 1000 in which that the pressure electrodes 450 and 460 are formed on one side of the display module 200 or the substrate 300, and the reference potential layer is the display module 200 or the substrate 300, and the frame 430 which causes the reference potential layer and the pressure electrodes 450 and 460 to be spaced apart from each other is disposed between the display module 200 and the substrate 300. However, the present invention is not limited to this. As shown in FIGS. 5*a* to 5*i*, this can be applied to a case where the reference potential layer is disposed within the display module 200, and the frame which causes the reference potential layer and the pressure electrodes 450 and 460 to be spaced apart from each other is the display module frames 221, 221-1, and 221-2.

Figure 3G:
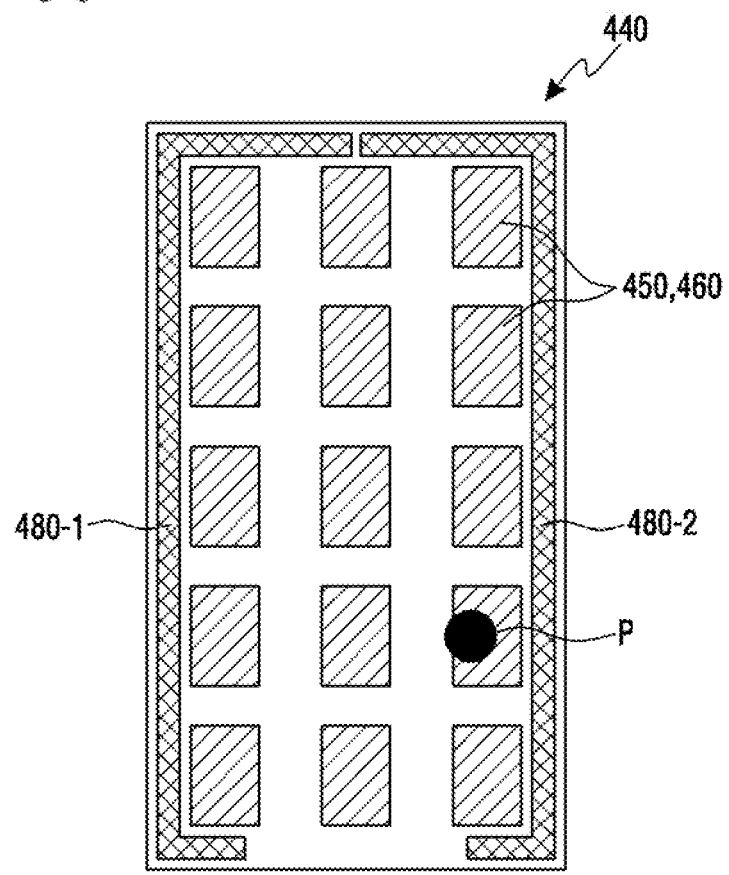
Figure 3H:
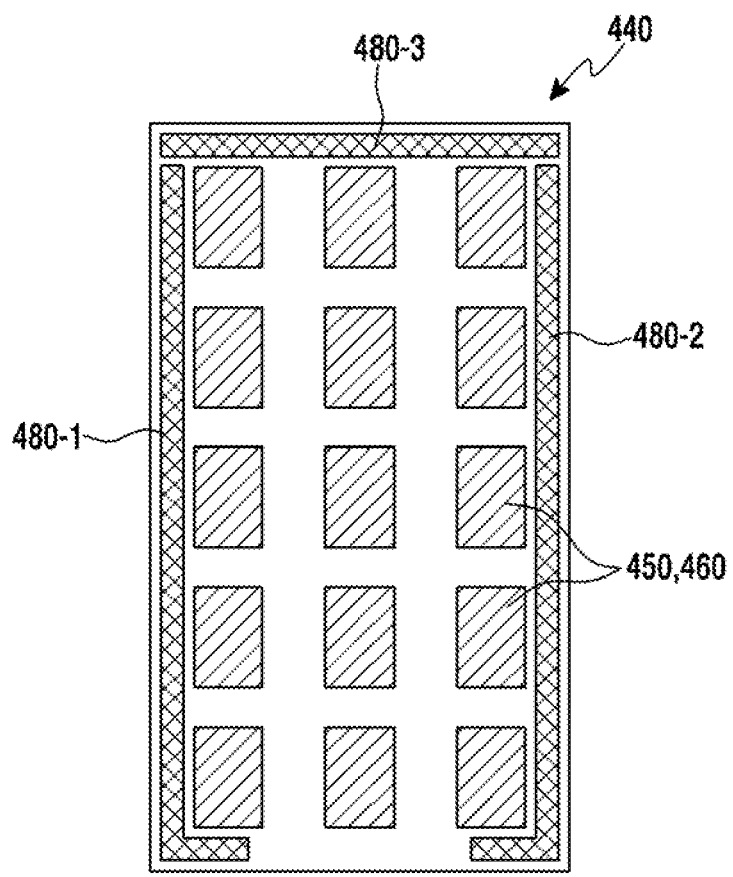

As shown in FIGS. 3*g* and 3*h*, the reference pressure electrode 480 may be composed of a plurality of electrodes. Specifically, the reference pressure electrode 480 may include a first reference pressure electrode 480-1, a second reference pressure electrode 480-2 and/or a third reference pressure electrode 480-3. When a pressure is applied to the reference pressure electrode 480 disposed at a position adjacent to the frame 430 shown in FIGS. 3*c* and 3*d*, the distance change between the reference pressure electrode 480 and the reference potential layer is small but not completely removed by the frame 430 without being deformed. On the other hand, the distance change between the reference potential layer and the reference pressure electrode 480 disposed at a position relatively far from the position where the pressure is applied is less than the distance change between the reference potential layer and the reference pressure electrode 480 disposed at a position relatively close to the position where the pressure is applied. Accordingly, depending on the position where the pressure is applied, the pressure detection accuracy can be further improved by using the reference pressure electrode 480 disposed at a position far from the position where the pressure is applied. For example, when the pressure is applied to a position P shown in FIG. 3*g*, the first reference pressure electrode 480-1 disposed at a position far from the position where the pressure is applied can be used as the reference pressure electrode.

Figure 3I:
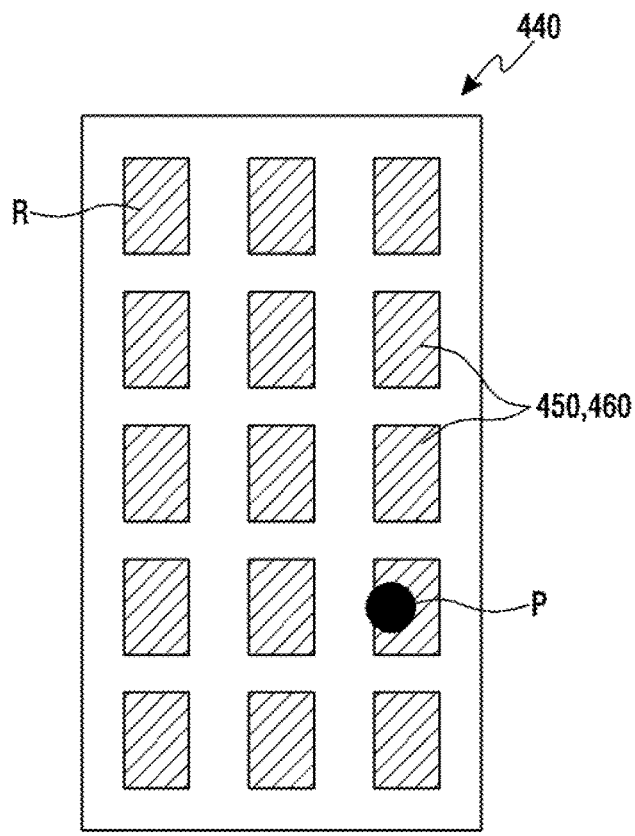

It has been described in FIGS. 3*b* to 3*h* that the electrode sheet 440 includes separately the reference pressure electrode 480 which is distinguished from the pressure electrodes 450 and 460. However, as shown in FIG. 3*i*, at least one of the plurality of pressure electrodes 450 and 460 included in the electrode sheet 440 can be used as reference pressure electrode. Specifically, the pressure electrodes 450 and 460 may include a first pressure electrode and a second pressure electrode. Here, in order to improve the pressure detection accuracy, the electrode disposed at a position farther from the position where the pressure is applied among the first pressure electrode and the second pressure electrode can be used as the reference pressure electrode. For example, when the pressure is applied to a position P shown in FIG. 3*i*, the pressure electrode R disposed at a position farther from the position where the pressure is applied can be used as the reference pressure electrode.

Figure 3J:
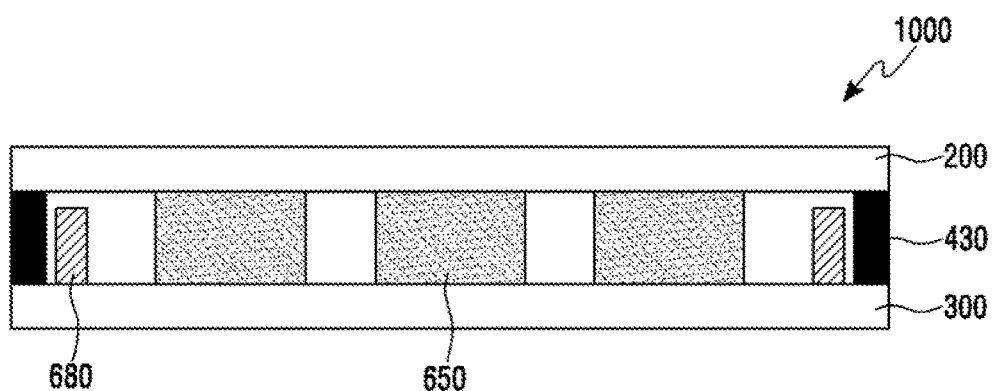
FIG. 3j is an exemplary cross sectional view of the touch input device including a pressure sensor and a reference pressure sensor according to the embodiment of the present invention.

In the touch input device 1000 shown in FIG. 3*j*, the pressure sensor, like a piezoelectric sensor, which has its property such as voltage, resistance or the like, changed by a pressure transmitted directly to the pressure sensor and detects the pressure may include a pressure detection sensor 650 and a reference pressure sensor 680. Here, as shown in FIG. 3*j*, when the reference pressure sensor 680 is disposed only at the border of the touch input device 1000 and the height of the reference pressure sensor 680 is made less than that of the pressure detection sensor 650 such that the display module 200 does not contact the reference pressure sensor 680 even if the touch pressure is applied, the physical property detected at the reference pressure sensor 680 is changed only in accordance with the change of the ambient environment including temperature. Likewise, a reference property can be calculated from the property detected at the reference pressure sensor 680, and the magnitude of the pressure applied to the touch surface can be calculated from the difference between the reference property and the property detected at the pressure detecting sensor 650.

As described above, in order to detect the pressure through the touch input device 1000 to which the electrode sheet 440 is applied according to the embodiment of the present invention, it is necessary to sense the capacitance change occurring in the pressure electrodes 450 and 460. Therefore, it is necessary for the driving signal to be applied to the drive electrode out of the first and second electrodes 450 and 460, and it is required to detect the touch pressure by the capacitance change amount by obtaining the sensing signal from the receiving electrode. According to the embodiment, it is possible to additionally include a pressure detection device in the form of a pressure sensing IC for the operation of the pressure detection. The pressure detection module 400 according to the embodiment of the present invention may include not only the electrode sheet 440 for pressure detection but also the pressure detection device.

In this case, the touch input device repeatedly has a configuration similar to the configuration of FIG. 1 including the drive unit 120, sensing unit 110, and controller 130, so that the area and volume of the touch input device 1000 increase.

According to the embodiment, the touch detection device 1000 may apply the driving signal for pressure detection to the electrode sheet 440 by using the touch detection device for the operation of the touch sensor panel 100, and may detect the touch pressure by receiving the sensing signal from the electrode sheet 440. Hereafter, the following description will be provided by assuming that the first electrode 450 is the drive electrode and the second electrode 460 is the receiving electrode.

For this, in the touch input device 1000 to which the electrode sheet 440 is applied according to the embodiment of the present invention, the driving signal may be applied to the first electrode 450 from the drive unit 120, and the second electrode 460 may transmit the sensing signal to the sensing unit 110. The controller 130 may perform the scanning of the touch sensor panel 100, and simultaneously perform the scanning of the touch pressure detection, or the controller 130 performs the time-sharing, and then may generate a control signal such that the scanning of the touch sensor panel 100 is performed in a first time interval and the scanning of the pressure detection is performed in a second time interval different from the first time interval.

Therefore, in the embodiment of the present invention, the first electrode 450 and the second electrode 460 should be electrically connected to the drive unit 120 and/or the sensing unit 110. Here, it is common that the touch detection device for the touch sensor panel 100 corresponds to the touch sensing IC 150 and is formed on one end of the touch sensor panel 100 or on the same plane with the touch sensor panel 100. The pressure electrode 450 and 460 included in the electrode sheet 440 may be electrically connected to the touch detection device of the touch sensor panel 100 by any method. For example, the pressure electrode 450 and 460 may be connected to the touch detection device through a connector by using the second PCB 210 included in the display module 200. For example, as shown in FIGS. 4*b* and 5*c*, the conductive traces which electrically extend from the first electrode 450 and the second electrode 460 respectively may be electrically connected to the touch sensing IC 150 through the second PCB 210, etc.

Figure 11A:
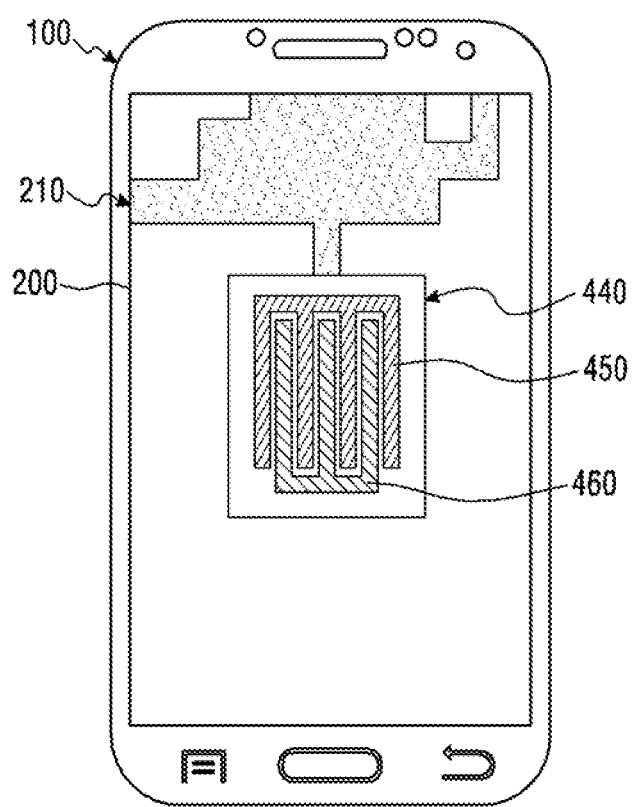
FIGS. 11a and 11b show how to attach the electrode sheet in accordance with the embodiment of the present invention.
Figure 11B:
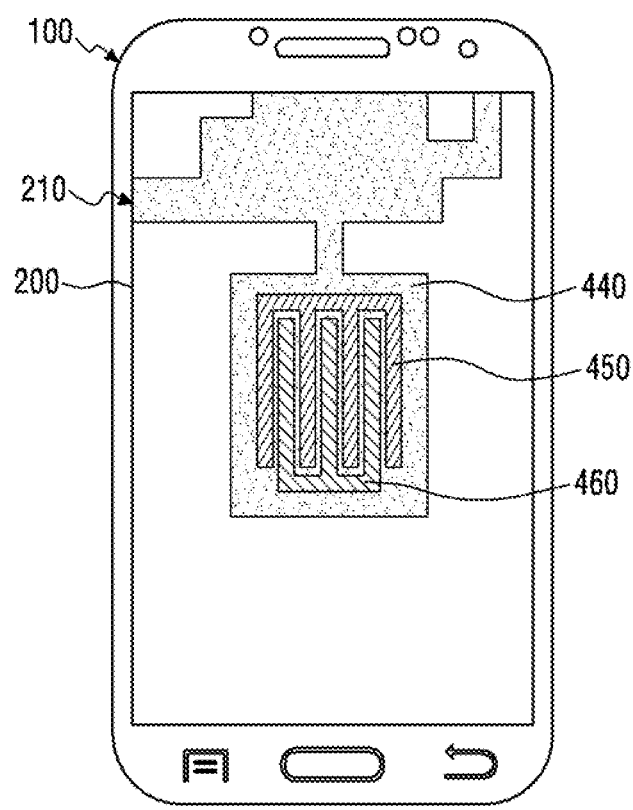

FIGS. 11*a* to 11*b* show that the electrode sheet 440 including the pressure electrodes 450 and 460 is attached to the bottom surface of the display module 200. FIGS. 11*a* and 11*b* show the second PCB 210 on which a circuit for the operation of the display panel has been mounted is disposed on a portion of the bottom surface of the display module 200.

FIG. 11*a* shows that the electrode sheet 440 is attached to the bottom surface of the display module 200 such that the first electrode 450 and the second electrode 460 are connected to one end of the second PCB 210 of the display module 200. Here, the first electrode 450 and the second electrode 460 may be connected to the one end of the second PCB 210 by using a double conductive tape. Specifically, since the thickness of the electrode sheet 440 and an interval between the substrate 300 and the display module 200 where the electrode sheet 440 is disposed are very small, the thickness can be effectively reduced by connecting both the first electrode 450 and the second electrode 460 to the one end of the second PCB 210 by using the double conductive tape rather than by using a separate connector. A conductive pattern may be printed on the second PCB 210 in such a manner as to electrically connect the pressure electrodes 450 and 460 to a necessary component like the touch sensing IC 150, etc. The detailed description of this will be provided with reference to FIGS. 12*a* to 12*c*. An attachment method of the electrode sheet 440 including the pressure electrodes 450 and 460 shown in FIG. 11*a* can be applied in the same manner to the substrate 300.

FIG. 11*b* shows that the pressure electrodes 450 and 460 are not manufactured of a separate electrode sheet but are integrally formed on the second PCB 210 of the display module 200. For example, when the second PCB 210 of the display module 200 is manufactured, a certain area is separated from the second PCB, and then not only the circuit for the operation of the display panel but also the pattern corresponding to the first electrode 450 and the second electrode 460 can be printed on the area 211. A conductive pattern may be printed on the second PCB 210 in such a manner as to electrically connect the first electrode 450 and the second electrode 460 to a necessary component like the touch sensing IC 150, etc.

Figure 12A:
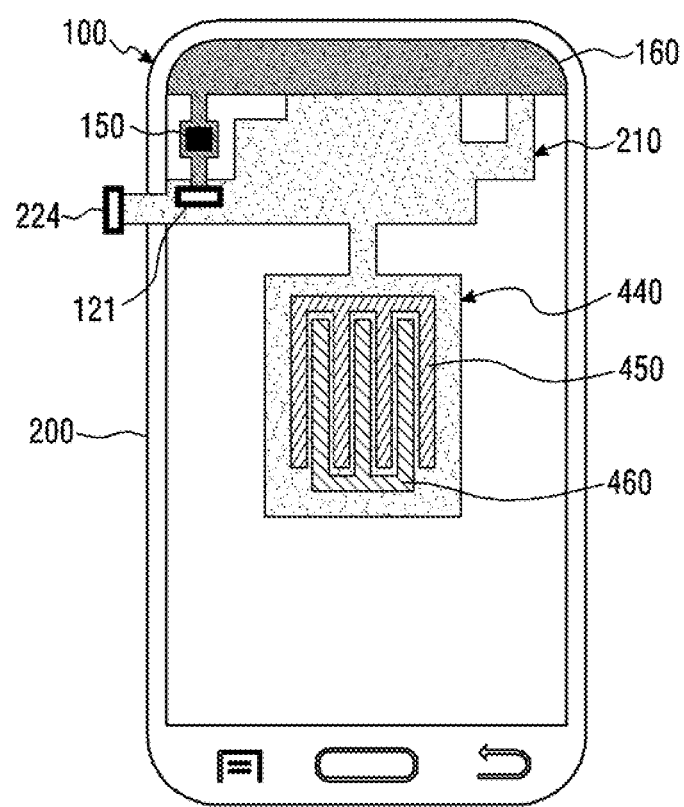
FIGS. 12a to 12c show how to connect the electrode sheet according to the embodiment of the present invention to a touch sensing circuit.
Figure 12B:
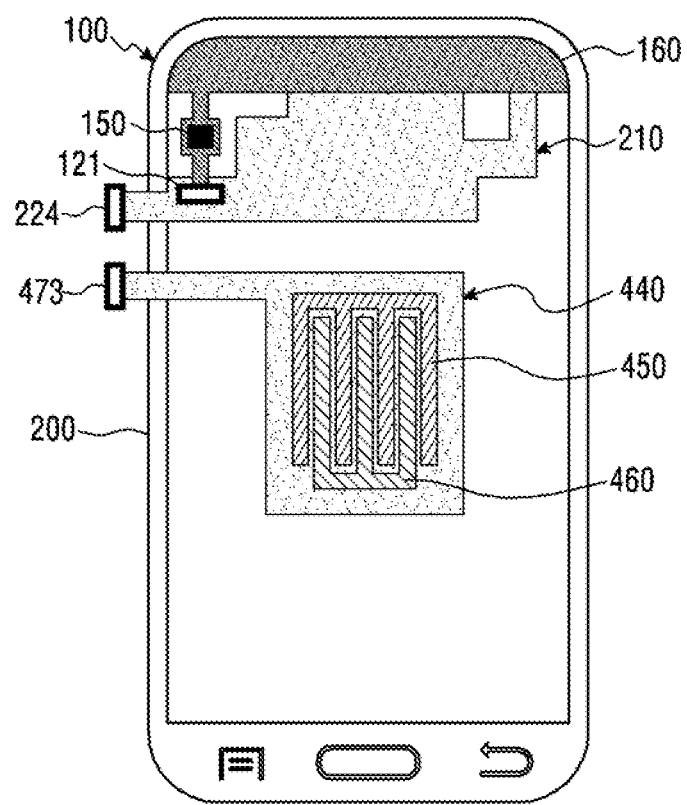
Figure 12C:
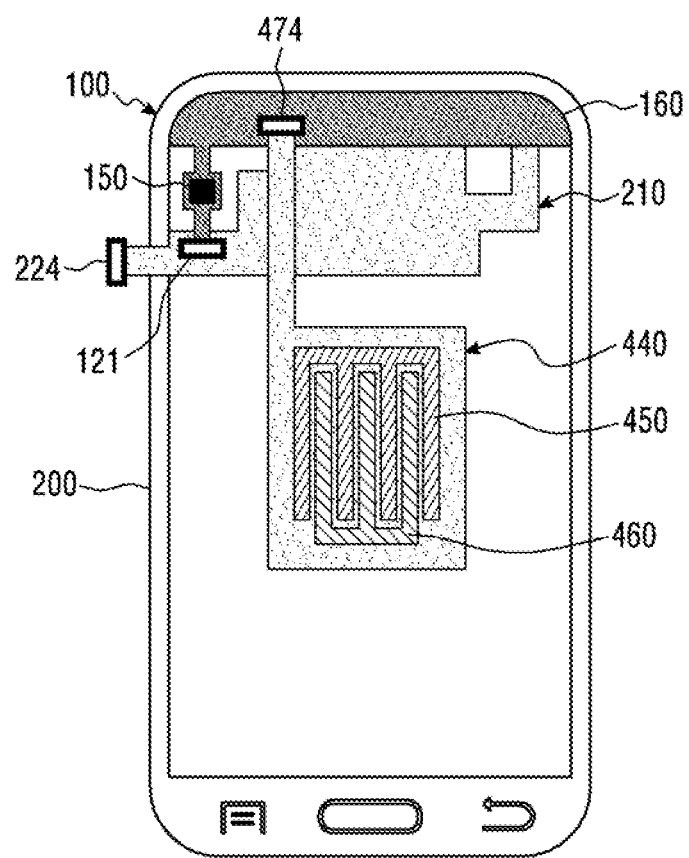

FIGS. 12*a* to 12*c* show a method for connecting the pressure electrodes 450 and 460 (or electrode sheet 440) to the touch sensing IC 150. In FIGS. 12*a* to 12*c*, the touch sensor panel 100 is included outside the display module 200. FIGS. 12*a* to 12*c* show that the touch detection device of the touch sensor panel 100 is integrated in the touch sensing IC 150 mounted on the first PCB 160 for the touch sensor panel 100.

FIG. 12*a* shows that the pressure electrodes 450 and 460 attached to the display module 200 are connected to the touch sensing IC 150 through a first connector 121. As shown in FIG. 12*a*, in a mobile communication device such as a smart phone, the touch sensing IC 150 is connected to the second PCB 210 for the display module 200 through the first connector 121. The second PCB 210 may be electrically connected to the main board through a second connector 224. Therefore, through the first connector 121 and the second connector 224, the touch sensing IC 150 may transmit and receive a signal to and from the CPU or AP for the operation of the touch input device 1000.

Here, while FIG. 12*a* shows that the electrode sheet 440 is attached to the display module 200 by the method shown in FIG. 11*b*, the first electrode 450 can be attached to the display module 200 by the method shown in FIG. 11*a*. A conductive pattern may be printed on the second PCB 210 in such a manner as to electrically connect the first electrode 450 and the second electrode 460 to the touch sensing IC 150 through the first connector 121.

FIG. 12*b* shows that the pressure electrodes 450 and 460 attached to the display module 200 are connected to the touch sensing IC 150 through a third connector 473. In FIG. 12*b*, the pressure electrodes 450 and 460 may be connected to the main board for the operation of the touch input device 1000 through the third connector 473, and in the future, may be connected to the touch sensing IC 150 through the second connector 224 and the first connector 121. Here, the pressure electrodes 450 and 460 may be printed on the additional PCB separated from the second PCB 210. Otherwise, according to the embodiment, the pressure electrodes 450 and 460 may be attached to the touch input device 1000 in the form of the electrode sheet 440 shown in FIGS. 3*b* to 3*i* and may be connected to the main board through the connector 473 by extending the conductive trace, etc., from the pressure electrodes 450 and 460.

FIG. 12*c* shows that the pressure electrodes 450 and 460 are directly connected to the touch sensing IC 150 through a fourth connector 474. In FIG. 12*c*, the pressure electrodes 450 and 460 may be connected to the first PCB 160 through the fourth connector 474. A conductive pattern may be printed on the first PCB 160 in such a manner as to electrically connect the fourth connector 474 to the touch sensing IC 150. As a result, the pressure electrodes 450 and 460 may be connected to the touch sensing IC 150 through the fourth connector 474. Here, the pressure electrodes 450 and 460 may be printed on the additional PCB separated from the second PCB 210. The second PCB 210 may be insulated from the additional PCB so as not to be short-circuited with each other. Also, according to the embodiment, the pressure electrodes 450 and 460 may be attached to the touch input device 1000 in the form of the electrode sheet 440 shown in FIGS. 3*b* to 3*i* and may be connected to the first PCB 160 through the connector 474 by extending the conductive trace, etc., from the pressure electrodes 450 and 460.

The connection method of FIGS. 12*b* and 12*c* can be applied to the case where the pressure electrode 450 and 460 are formed on the substrate 300 as well as on the bottom surface of the display module 200.

FIGS. 12*a* to 12*c* have been described by assuming that a chip on board (COB) structure in which the touch sensing IC 150 is formed on the first PCB 160. However, this is just an example. The present invention can be applied to the chip on board (COB) structure in which the touch sensing IC 150 is mounted on the main board within the mounting space 310 of the touch input device 1000. It will be apparent to those skilled in the art from the descriptions of FIGS. 12*a* to 12*c* that the connection of the pressure electrodes 450 and 460 through the connector can be also applied to another embodiment.

The foregoing has described the pressure electrodes 450 and 460, that is to say, has described that the first electrode 450 constitutes one channel as the drive electrode and the second electrode 460 constitutes one channel as the receiving electrode. However, this is just an example. According to the embodiment, the drive electrode and the receiving electrode constitute a plurality of channels respectively, so that it is possible to detect multi pressure according to multi touch.

Figure 13A:
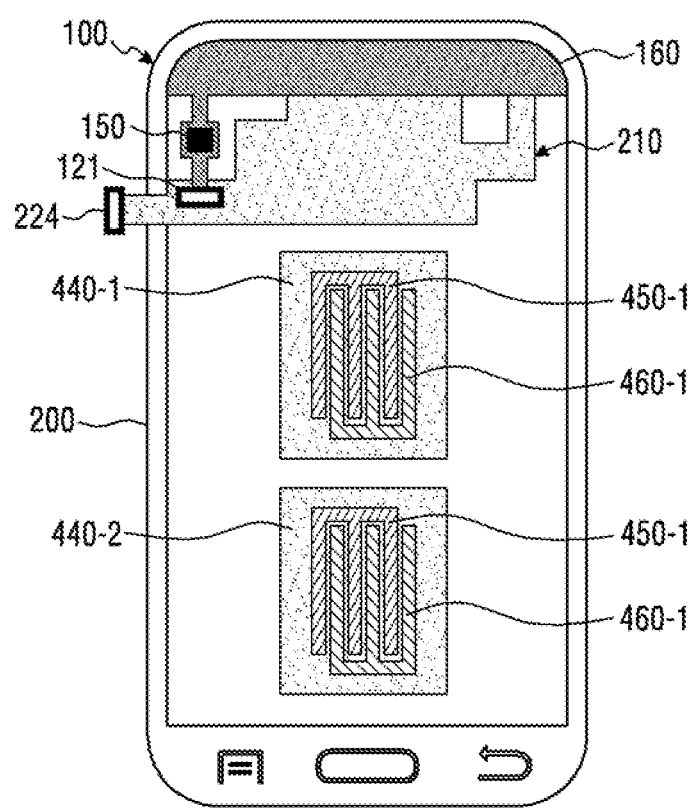
FIGS. 13a to 13d show a configuration in which the electrode sheet according to the embodiment of the present invention includes a plurality of channels.
Figure 13B:
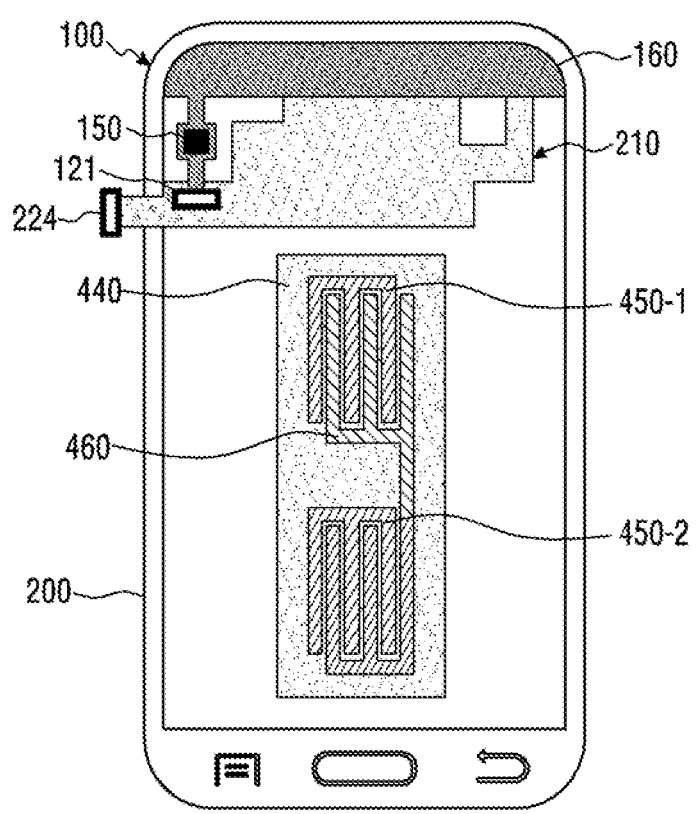
Figure 13C:
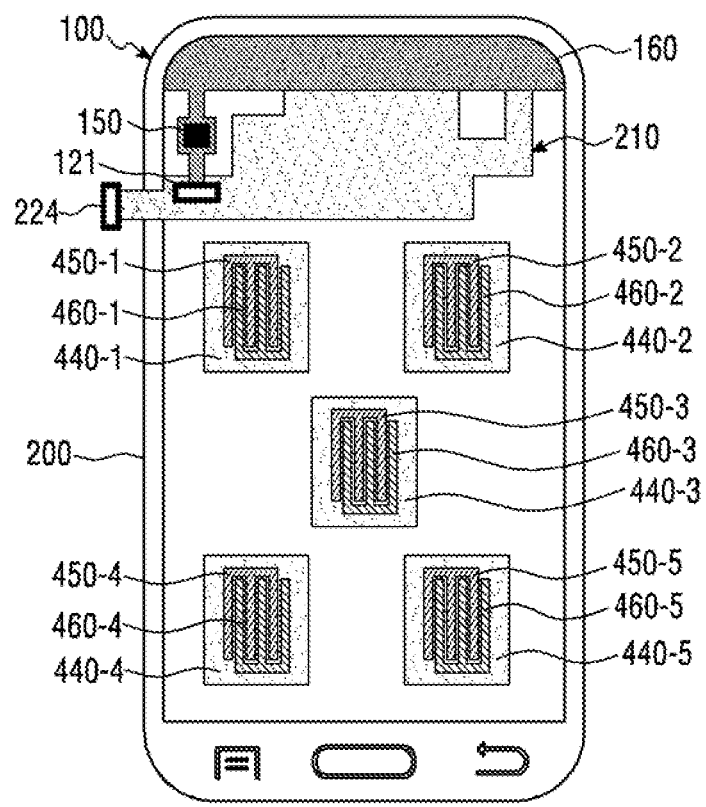
Figure 13D:
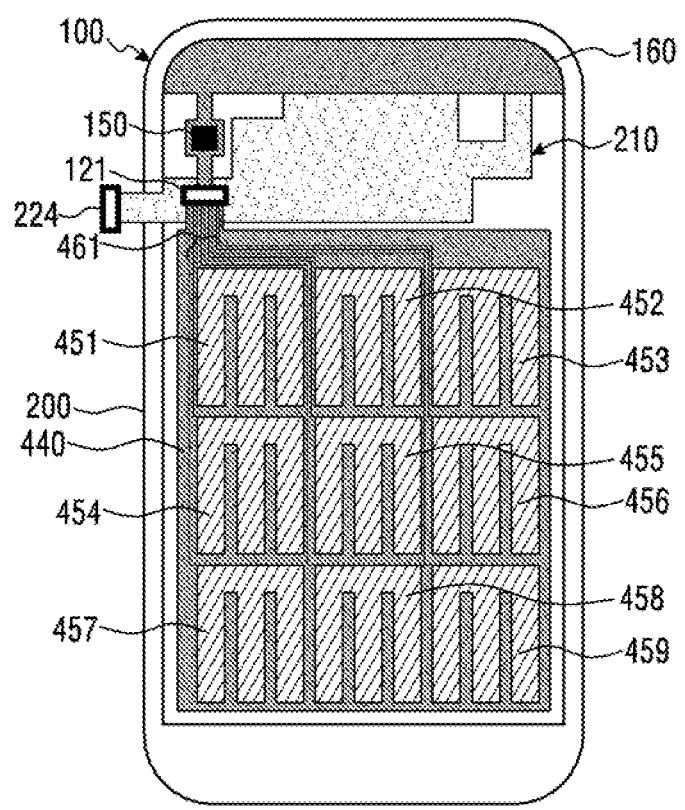

FIGS. 13*a* to 13*d* show that the pressure electrode of the present invention constitutes the plurality of channels. FIG. 13*a* shows first electrodes 450-1 and 450-2 and second electrodes 460-1 and 460-2 constitute two channels respectively. Though FIG. 13*a* shows that the first electrode 450-1 and the second electrode 460-1 which constitute a first channel are included in the first electrode sheet 440-1 and the first electrode 450-2 and the second electrode 460-2 which constitute a second channel are included in the second electrode sheet 440-2, all of the first electrodes 450-1 and 450-2 and the second electrodes 460-1 and 460-2 which constitute the two channels may be included in one electrode sheet 440. FIG. 13*b* shows that the first electrodes 450-1 and 450-2 constitute two channels and the second electrode 460 constitutes one channel. FIG. 13*c* shows the first electrode 450-1 to 450-5 constitute five channels and the second electrode 460-1 to 460-5 constitute five channels. Even in this case, all of the electrodes constituting the five channels may be also included in one electrode sheet 440. FIG. 13*d* shows that first electrodes 451 to 459 constitute nine channels and all of the first electrodes 451 to 459 are included in one electrode sheet 440.

As shown in FIGS. 13*a* to 13*d* and 14*a* to 14*c*, when the plurality of channels are formed, a conductive pattern which is electrically connected to the touch sensing IC 150 from each of the first electrode 450 and/or the second electrode 460 may be formed.

Here, described is a case in which the plurality of channels shown in FIG. 13*d* are constituted. In this case, since a plurality of conductive patterns 461 should be connected to the first connector 121 with a limited width, a width of the conductive pattern 461 and an interval between the adjacent conductive patterns 461 should be small. Polyimide is more suitable for a fine process of forming the conductive pattern 461 with such a small width and interval than polyethylene terephthalate. Specifically, the first insulation layer 470 or the second insulation layer 471 of the electrode sheet 440, in which the conductive pattern 461 is formed, may be made of polyimide. Also, a soldering process may be required to connect the conductive pattern 461 to the first connector 121. For a soldering process which is performed at a temperature higher than 300° C., polyimide resistant to heat is more suitable than polyethylene terephthalate relatively vulnerable to heat. Here, for the purpose of reducing production costs, a portion of the first insulation layer 470 or the second insulation layer 471, in which the conductive pattern 461 is not formed, may be made of polyethylene terephthalate, and a portion of the first insulation layer 470 or the second insulation layer 471, in which the conductive pattern 461 is formed, may be made of polyimide.

FIGS. 13*a* to 13*d* and 14*a* to 14*c* show that the pressure electrode constitutes a single or a plurality of channels. The pressure electrode may be comprised of a single or a plurality of channels by a variety of methods. While FIGS. 13*a* to 13*c* and 14*a* to 14*c* do not show that the pressure electrodes 450 and 460 are electrically connected to the touch sensing IC 150, the pressure electrodes 450 and 460 can be connected to the touch sensing IC 150 by the method shown in FIGS. 12*a* to 12*c* and other methods.

In the foregoing description, the first connector 121 or the fourth connector 474 may be a double conductive tape.

Specifically, since the first connector 121 or the fourth connector 474 may be disposed at a very small interval, the thickness can be effectively reduced by using the double conductive tape rather than a separate connector.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

The invention claimed is:

1. A touch input device capable of detecting a pressure of a touch on a touch surface, the touch input device comprising:
   a display module;
   a pressure electrode disposed under the display module; and
   a reference pressure electrode disposed under the display module, the reference pressure electrode being disposed under an area where a screen of the touch input device is not displayed,
      wherein a distance between the pressure electrode and a reference potential layer is changed when the pressure is applied to the touch surface,
      wherein a capacitance detected at the pressure electrode is changed according to the distance change,
      wherein, when the pressure is applied to the touch surface, the distance change between the reference pressure electrode and the reference potential layer is less than the distance change between the reference potential layer and the pressure electrode disposed under the position where the pressure is applied,
      and wherein a magnitude of the pressure applied to the touch surface is calculated on the basis of a difference between a reference capacitance calculated from a capacitance detected at the reference pressure electrode and a detected capacitance calculated from the capacitance detected at the pressure electrode.

2. The touch input device of claim 1, wherein the reference pressure electrode is disposed on the outside of the pressure electrode.

3. The touch input device of claim 1, wherein the reference pressure electrode is disposed under an area where a position of the touch input to the touch input device is not sensed.

4. The touch input device of claim 1, further comprising a frame which is made of an inelastic material and causes the pressure electrode and the reference potential layer to be spaced apart from each other,
   wherein the frame is disposed at a border of the touch input device,
   and wherein the reference pressure electrode is disposed adjacent to the frame.

5. The touch input device of claim 1, further comprising a frame which is made of an inelastic material and causes the pressure electrode and the reference potential layer to be spaced apart from each other,
   wherein the frame is disposed at a border of the touch input device,
   and wherein the reference pressure electrode is disposed on or under the frame.

6. The touch input device of claim 1,
   wherein the reference pressure electrode comprises a first reference pressure electrode and a second reference pressure electrode,
   and wherein the magnitude of the pressure which is applied to the touch surface is calculated on the basis of a difference between a reference capacitance calculated from a capacitance which is detected at an electrode disposed at a position relatively farther from the position where the pressure is applied among the first reference pressure electrode and the second reference pressure electrode and the detected capacitance calculated from the capacitance detected at the pressure electrode.

7. The touch input device of claim 1, wherein the pressure electrode constitutes a plurality of channels, and wherein multi pressure according to multi-touch is detectable by using the plurality of channels.

8. The touch input device of claim 1, wherein, when the pressure is applied to the display module, the display module is bent, and the distance between the pressure electrode and the reference potential layer is changed by the bending of the display module.

9. The touch input device of claim 1, wherein the reference potential layer is disposed within the display module.

10. A touch input device capable of detecting a pressure of a touch on a touch surface, the touch input device comprising:
    a display module; and
    a first pressure electrode and a second pressure electrode which are disposed under the display module,
       wherein, when the pressure is applied to the touch surface, a distance between the first pressure electrode and a reference potential layer or a distance between the second pressure electrode and the reference potential layer is changed,
       wherein a capacitance detected at the first pressure electrode or the second pressure electrode is changed according to the distance change,
       wherein, when the pressure is applied to the touch surface, a distance change between the reference potential layer and an electrode disposed at a position relatively closer to the position where the pressure is applied among the first pressure electrode and the second pressure electrode is less than a distance change between the reference potential layer and an electrode disposed at a position relatively farther from the position where the pressure is applied among the first pressure electrode and the second pressure electrode,
       and wherein a magnitude of the pressure which is applied to the touch surface is calculated on the basis of a difference between a reference capacitance calculated from a capacitance which is detected at an electrode disposed at a position relatively farther from the position where the pressure is applied among the first pressure electrode and the second pressure electrode and a detected capacitance calculated from a capacitance which is detected at an electrode disposed at a position relatively closer to the position where the pressure is applied among the first pressure electrode and the second pressure electrode.

11. The touch input device of claim 10, further comprising a frame which is made of an inelastic material and causes the pressure electrode and the reference potential layer to be spaced apart from each other, wherein the frame is disposed at a border of the touch input device, and wherein the first pressure electrode or the second pressure electrode is disposed adjacent to the frame.

12. The touch input device of claim 10, wherein the first pressure electrode and the second pressure constitute a plurality of channels, and wherein multi pressure according to multi-touch is detectable by using the plurality of channels.

13. The touch input device of claim 10, wherein, when the pressure is applied to the display module, the display module is bent, and the distance between the first pressure electrode and the reference potential layer or the distance between the second pressure electrode and the reference potential layer is changed by the bending of the display module.

14. The touch input device of claim 10, wherein the reference potential layer is disposed within the display module.

15. An electrode sheet which is disposed in a touch input device comprising a substrate and a display module, the electrode sheet comprising:
a first insulation layer and a second insulation layer;
a pressure electrode located between the first insulation layer and the second insulation layer; and
a reference pressure electrode located between the first insulation layer and the second insulation layer, the reference pressure electrode being disposed under an area where a screen of the touch input device is not displayed,
wherein a capacitance which is detected at the pressure electrode is changed according to a relative distance change between the pressure electrode and a reference potential layer spaced apart from the electrode sheet,
wherein, when the pressure is applied to the touch surface of the touch input device, the distance change between the reference pressure electrode and the reference potential layer is less than the distance change between the reference potential layer and the pressure electrode disposed under the position where the pressure is applied,
and wherein the electrode sheet is used to calculate a magnitude of a pressure applied to a touch surface of the touch input device on the basis of a difference between a reference capacitance calculated from a capacitance detected at the reference pressure electrode and a detected capacitance calculated from the capacitance detected at the pressure electrode.

16. The electrode sheet of claim 15, wherein the reference pressure electrode is disposed on the outside of the pressure electrode.

17. The electrode sheet of claim 15,
wherein the reference pressure electrode comprises a first reference pressure electrode and a second reference pressure electrode,
and wherein the electrode sheet is used to calculate the magnitude of the pressure which is applied to the touch surface on the basis of a difference between a reference capacitance calculated from a capacitance which is detected at an electrode disposed at a position relatively farther from the position where the pressure is applied among the first reference pressure electrode and the second reference pressure electrode and the detected capacitance calculated from the capacitance detected at the pressure electrode.

18. The electrode sheet of claim 15, wherein the pressure electrode constitutes a plurality of channels, and wherein the pressure electrode constitutes a plurality of channels.

19. The electrode sheet of claim 15,
wherein the electrode sheet is attached to the touch input device comprising the substrate and the display module,
and wherein, when a pressure is applied to the display module, the display module is bent, and the distance between the pressure electrode and the reference potential layer is changed by the bending of the display module.

20. The electrode sheet of claim 15,
wherein the electrode sheet is attached to the touch input device comprising the substrate and the display module,
and wherein the reference potential layer is disposed within the display module.

21. An electrode sheet which is disposed in a touch input device comprising a substrate and a display module, the electrode sheet comprising:
a first insulation layer and a second insulation layer; and
a first pressure electrode and a second pressure electrode which are located between the first insulation layer and the second insulation layer,
wherein a capacitance which is detected at the first pressure electrode is changed according to a relative distance change between the first pressure electrode and a reference potential layer spaced apart from the electrode sheet, alternatively, a capacitance which is detected at the second pressure electrode is changed according to a relative distance change between the second pressure electrode and the reference potential layer spaced apart from the electrode sheet,
wherein, when the pressure is applied to the touch surface, a distance change between the reference potential layer and an electrode disposed at a position relatively closer to the position where the pressure is applied among the first pressure electrode and the second pressure electrode is less than a distance change between the reference potential layer and an electrode disposed at a position relatively farther from the position where the pressure is applied among the first pressure electrode and the second pressure electrode,
and wherein the electrode sheet is used to a magnitude of a pressure which is applied to a touch surface of the touch input device on the basis of a difference between a reference capacitance calculated from a capacitance which is detected at an electrode disposed at a position relatively farther from a position where the pressure is applied among the first pressure electrode and the second pressure electrode and a detected capacitance calculated from a capacitance which is detected at an electrode disposed at a position relatively closer to the position where the pressure is applied among the first pressure electrode and the second pressure electrode.

22. The electrode sheet of claim 21, wherein the first pressure electrode and the second pressure constitute a plurality of channels, and wherein multi pressure according to multi-touch is detectable by using the plurality of channels.

23. The electrode sheet of claim 21,
wherein the electrode sheet is attached to the touch input device comprising the substrate and the display module, and wherein, when a pressure is applied to the display module, the display module is bent, and a distance between the first pressure electrode and the reference potential layer or a distance between the second pressure electrode and the reference potential layer is changed by the bending of the display module.

24. The electrode sheet of claim 21,
wherein the electrode sheet is attached to the touch input device comprising the substrate and the display module,
and wherein the reference potential layer is disposed within the display module.

* * * * *